United States Patent
Tanigawa et al.

(10) Patent No.: US 10,957,964 B2
(45) Date of Patent: *Mar. 23, 2021

(54) MULTILAYER TRANSMISSION LINE PLATE

(71) Applicant: HITACHI CHEMICAL COMPANY, LTD., Tokyo (JP)

(72) Inventors: Takao Tanigawa, Tokyo (JP); Tetsurou Irino, Tokyo (JP); Yuusuke Kondou, Tokyo (JP); Etsuo Mizushima, Tokyo (JP); Tomio Fukuda, Tokyo (JP); Yuki Nagai, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/069,542

(22) PCT Filed: Jul. 20, 2016

(86) PCT No.: PCT/JP2016/071281
§ 371 (c)(1),
(2) Date: Jul. 12, 2018

(87) PCT Pub. No.: WO2017/122376
PCT Pub. Date: Jul. 20, 2017

(65) Prior Publication Data
US 2019/0023899 A1    Jan. 24, 2019

(30) Foreign Application Priority Data
Jan. 13, 2016  (JP) .............................. JP2016-004365

(51) Int. Cl.
*H01P 3/08*  (2006.01)
*H05K 1/02*  (2006.01)
(Continued)

(52) U.S. Cl.
CPC ........ *H01P 3/082* (2013.01); *C08G 65/33396* (2013.01); *C08G 73/121* (2013.01);
(Continued)

(58) Field of Classification Search
CPC . C08L 79/08; C08G 73/121; C08G 65/33396; H01L 23/12; H01B 11/00;
(Continued)

(56) References Cited

U.S. PATENT DOCUMENTS 9,307,636 B2 *  4/2016  Kato ...................... H05K 1/024
2010/0200276 A1  8/2010  Karikalan
(Continued)

FOREIGN PATENT DOCUMENTS

CN    101990357 A    3/2011
CN    103718657 A    4/2014
(Continued)

OTHER PUBLICATIONS

Machine English Translation of JP2007208473A Published on Aug. 16, 2007 (Year: 2007).*

*Primary Examiner* — Rakesh B Patel
*Assistant Examiner* — Jorge L Salazar, Jr.
(74) *Attorney, Agent, or Firm* — Fitch, Even, Tabin & Flannery, L.L.P.

(57) ABSTRACT

Provided is a multilayered transmission line plate including one pair of ground layers, a differential wiring layer disposed between one ground layer and the other ground layer of the one pair of ground layers, a first insulating portion disposed between the differential wiring layer and the one ground layer, and a second insulating portion disposed between the differential wiring layer and the other ground layer, wherein the first insulating portion has a resin layer, the first insulating portion or the second insulating portion has a fiber base material layer including a fiber base mate-
(Continued)

rial, and a thickness of the first insulating portion is equal to or thinner than a thickness of the second insulating portion.

9 Claims, 5 Drawing Sheets

(51) Int. Cl.
  *H01B 7/08* (2006.01)
  *H01L 23/12* (2006.01)
  *H05K 1/03* (2006.01)
  *H05K 3/46* (2006.01)
  *H01B 11/00* (2006.01)
  *C08G 65/333* (2006.01)
  *C08G 73/12* (2006.01)
  *C08J 5/24* (2006.01)
  *C08L 79/08* (2006.01)
  *H01P 11/00* (2006.01)

(52) U.S. Cl.
  CPC .............. *C08J 5/24* (2013.01); *C08L 79/08* (2013.01); *H01B 7/08* (2013.01); *H01B 11/00* (2013.01); *H01L 23/12* (2013.01); *H01P 11/003* (2013.01); *H05K 1/0248* (2013.01); *H05K 1/036* (2013.01); *H05K 1/0366* (2013.01); *H05K 3/4688* (2013.01); *C08J 2379/08* (2013.01); *C08J 2471/12* (2013.01); *H05K 1/0346* (2013.01); *H05K 2201/0191* (2013.01)

(58) Field of Classification Search
  CPC ..... H01B 7/08; C08J 2379/08; C08J 2471/12; C08J 5/24; H05K 1/0225; H05K 1/025; H05K 3/46; H05K 1/02; H05K 1/036; H05K 3/4688; H05K 1/0248; H05K 1/0366; H05K 1/038; H05K 2201/0191; H05K 1/0346; H05K 1/0218; H05K 1/0246; H01P 3/08; H01P 11/003; H01P 3/082; H01P 3/04; H01P 3/026
  USPC .................................. 333/1, 5, 12, 238, 246
  See application file for complete search history.

(56) References Cited

U.S. PATENT DOCUMENTS

| | | |
|---|---|---|
| 2011/0025434 A1 | 2/2011 | Hseih et al. |
| 2014/0158406 A1 | 6/2014 | Kato et al. |
| 2014/0350901 A1 | 11/2014 | Nagaoka |
| 2015/0118463 A1 | 4/2015 | Nakamura |
| 2015/0327358 A1 | 11/2015 | Hidaka |
| 2018/0139837 A1 | 5/2018 | Kondou et al. |

FOREIGN PATENT DOCUMENTS

| | | |
|---|---|---|
| JP | 2004-099377 A | 4/2004 |
| JP | 2006-232952 A | 9/2006 |
| JP | 2007-096159 A | 4/2007 |
| JP | 2007-208473 A | 8/2007 |
| JP | 2009-259879 A | 11/2009 |
| JP | 2013-083958 A | 5/2013 |
| SG | 11201705578 | 8/2017 |
| WO | 2013/012053 A1 | 2/2015 |

* cited by examiner

[Fig. 1]
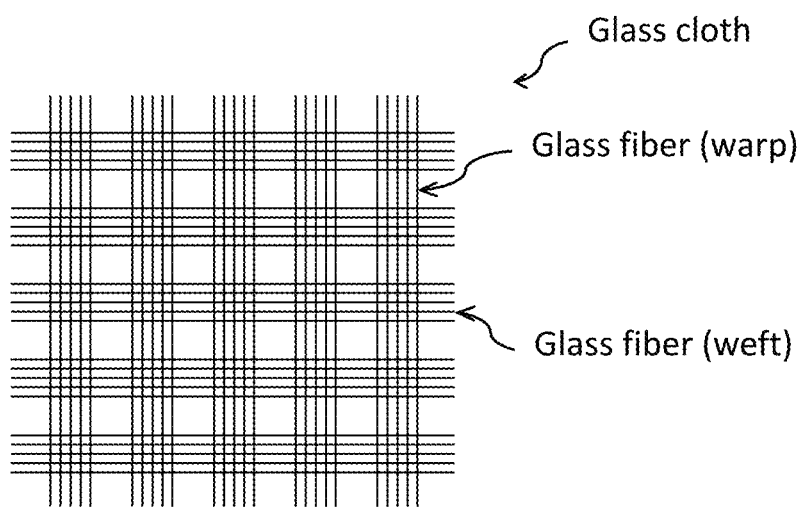

[Fig. 2]
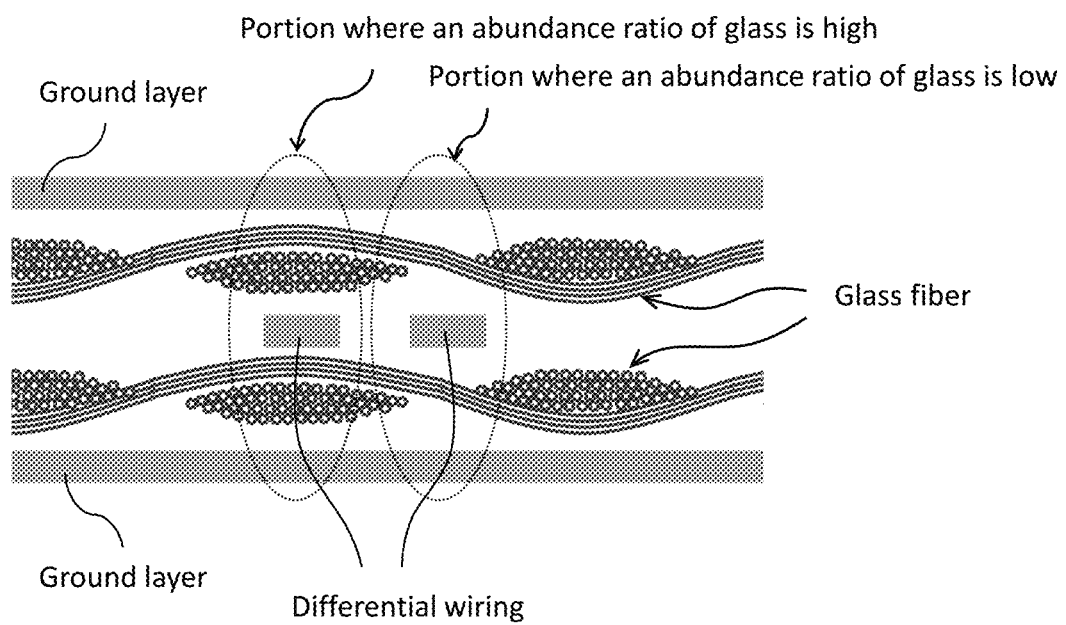

[Fig. 3]
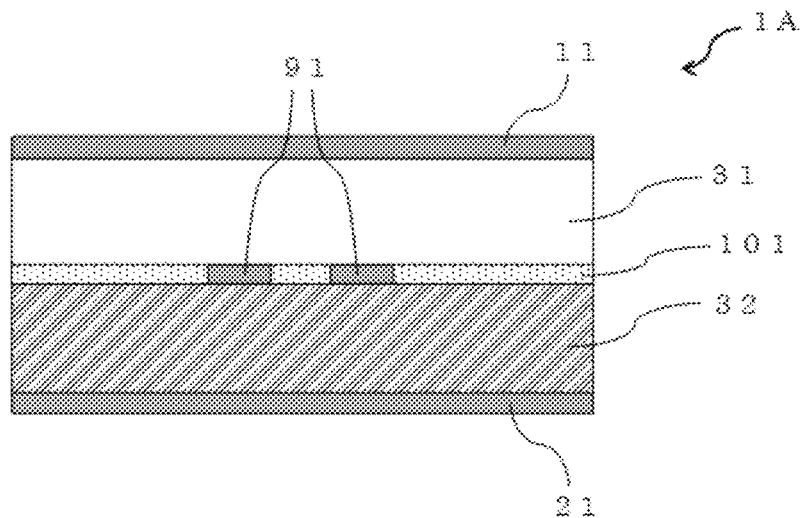
[Fig. 4]
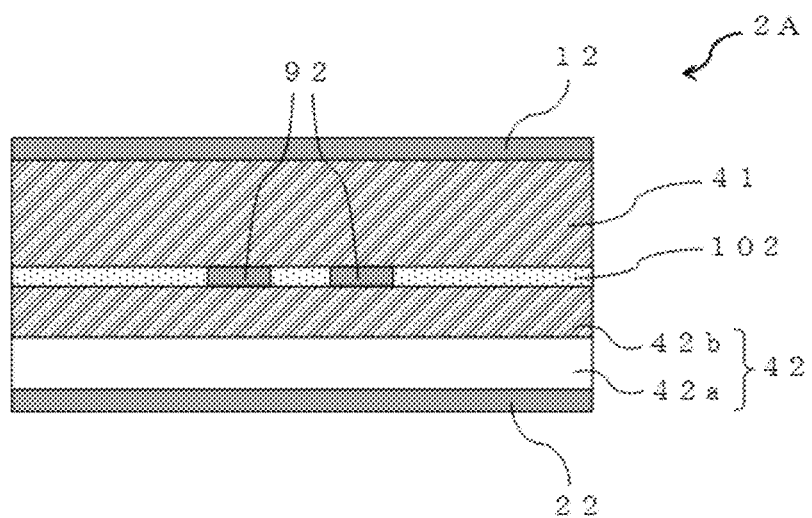

[Fig. 5]
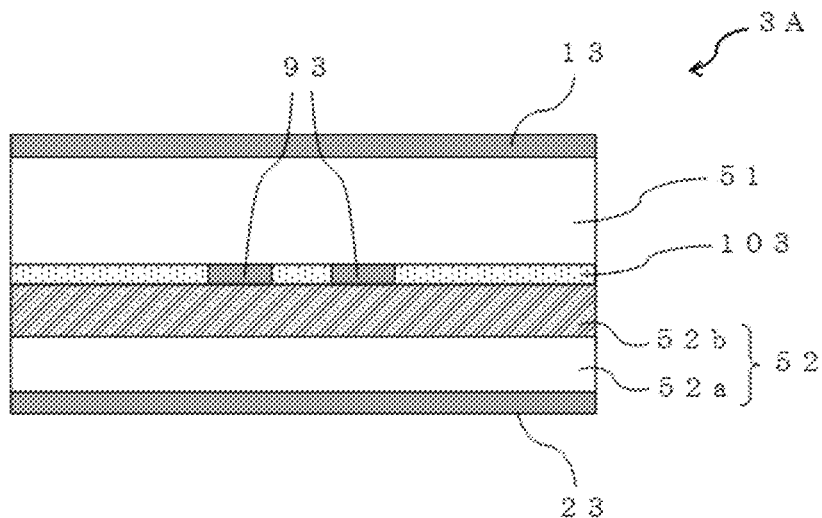
[Fig. 6]
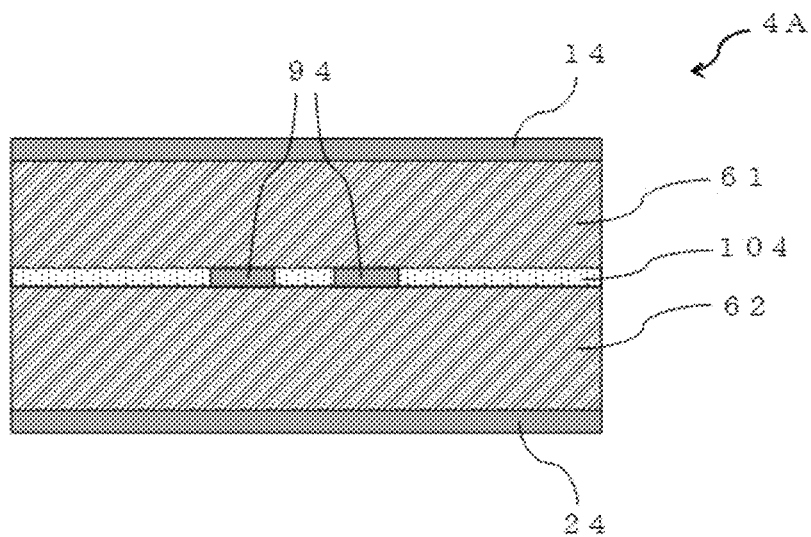

[Fig. 7]
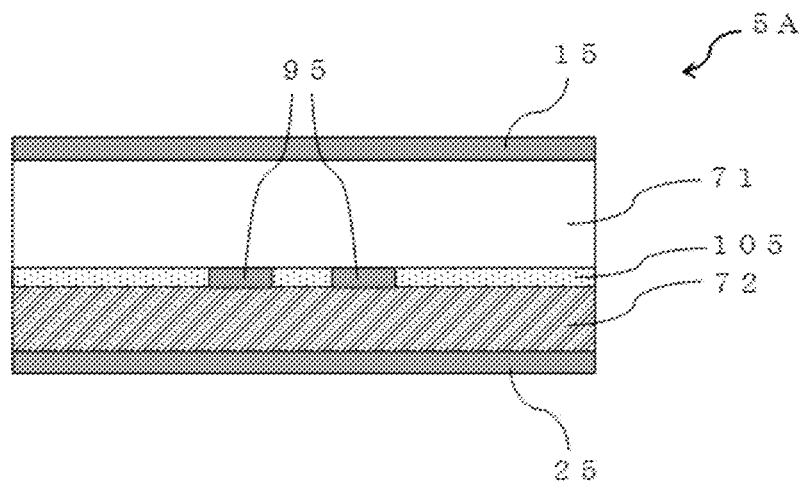
[Fig. 8]
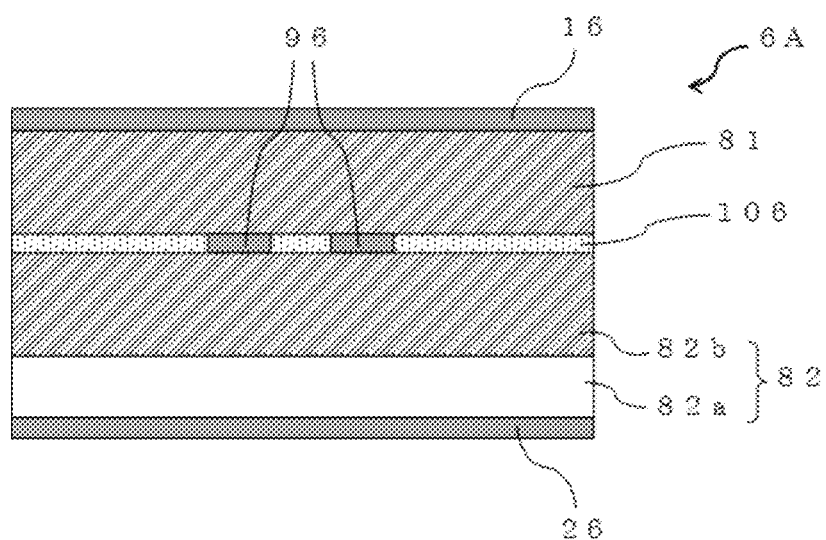

MULTILAYER TRANSMISSION LINE PLATE

CROSS-REFERENCE TO RELATED APPLICATIONS

This application is a U.S. national phase application filed under 35 U.S.C. § 371 of International Application No. PCT/JP2016/071281, filed Jul. 20, 2016, designating the United States, which claims benefit from Japanese Patent Application 2016-004365, filed Jan. 13, 2016, which are hereby incorporated herein by reference in their entirety.

TECHNICAL FIELD

The present invention relates to a multilayered transmission line plate, and more specifically, to a multilayered transmission line plate to be used for high-speed digital transmission by a Gbps-order differential transmission system.

BACKGROUND ART

Following an increase in speed of signal, a differential transmission system is widely adopted. Although the differential transmission system is advantageous for noise reduction, as the signal becomes faster, signal degradation due to generation of a common-mode noise has become problematic.

Now, in an insulating layer of the multilayered transmission line plate, in order to secure handling properties of materials at the time of manufacturing the multilayered transmission line plate, mechanical properties of the multilayered transmission line plate itself, and the like, a composite material of a fiber base material such as a glass cloth, etc. and a resin is widely used.

As shown in FIG. 1, the glass cloth has a structure in which glass fibers are woven vertically and horizontally, and therefore, the glass fibers overlap in a weave texture portion. Accordingly, in the composite material of the glass cloth and the resin, an abundance ratio of glass becomes high in the weave texture portion of glass fibers. Conversely, the abundance ratio of glass becomes low in a portion where the glass fibers do not overlap. In general, since the resin and the glass are different from each other in a dielectric constant, when the abundance ratio between the resin and the glass within the composite material plane is heterogeneous, the dielectric constant within the composite material plane becomes heterogeneous, too.

As shown in FIG. 2, in a multilayered transmission line plate in which a differential wiring is formed, there is caused a case where a wiring is present in a portion where the abundance ratio of glass is high and a portion where the abundance ratio of glass is low. However, since the signal speed is different in the respective places, a deviation (skew) in the arrival time of signal is generated at a receiving side, thereby resulting in lowering of signal quality.

As a skew countermeasure, a measure by a design technology, such as oblique disposition of a wiring pattern against the weaving direction of glass, etc., is taken. However, according to this method, imposition of the wiring pattern becomes inefficient, resulting in a material loss. Thus, other solution means is required.

PTL 1 discloses a method of concentratedly adding fillers having a high dielectric constant in portions of a glass cloth that are not a weave texture, thereby making the dielectric constant within the composite material plane homogeneous.

CITATION LIST

Patent Literature

PTL 1: JP 2009-259879 A

SUMMARY OF INVENTION

Technical Problem

However, according to the method of PTL 1, since a production process of materials becomes complicated, there was a case where not only the material cost is increased, but also control of the material quality becomes difficult.

Then, an object of the present invention is to provide a multilayered transmission line plate which is capable of reducing a skew in the differential transmission and is excellent in handling properties without adopting a complicated process.

Solution to Problem

In order to solve the aforementioned problem, the present inventors made intensive investigations. As the result, it has been found that the foregoing problem can be solved by the present invention as mentioned below. Specifically, the present invention provides the following [1] to [10].

A multilayered transmission line plate including: one pair of ground layers, a differential wiring layer disposed between one ground layer and the other ground layer of the one pair of ground layers, a first insulating portion disposed between the differential wiring layer and the one ground layer, and a second insulating portion disposed between the differential wiring layer and the other ground layer, wherein the first insulating portion has a resin layer, the first insulating portion or the second insulating portion has a fiber base material layer including a fiber base material, and a thickness of the first insulating portion is equal to or thinner than a thickness of the second insulating portion.

The multilayered transmission line plate of [1], including an insulating layer (1-I) as the first insulating portion and an insulating layer (1-II) as the second insulating portion, wherein the insulating layer (1-I) is a resin layer and the insulating layer (1-II) is a fiber base material layer.

The multilayered transmission line plate of [1], including an insulating layer (2-I) as the second insulating portion and an insulating layer (2-II) as the first insulating portion, wherein the insulating layer (2-II) includes two or more layers of an insulating layer (2-IIA) and an insulating layer (2-IIB) laminated on the insulating layer (2-IIA), the insulating layer (2-I) is a fiber base material layer, the insulating layer (2-IIA) is a resin layer, and the insulating layer (2-IIB) is a fiber base material layer.

The multilayered transmission line plate of any one of [1] to [3], wherein the resin layer includes (A) a maleimide group-containing compound containing (a1) a divalent group having at least two imide bonds and (a2) a saturated or unsaturated divalent hydrocarbon group.

The multilayered transmission line plate of [4], wherein (a2) the saturated or unsaturated divalent hydrocarbon group is a divalent aliphatic hydrocarbon group having 8 to 100 carbon atoms.

The multilayered transmission line plate of [4] or [5], wherein (A) the maleimide group-containing compound is an N-aliphatic substituted maleimide group-containing compound.

The multilayered transmission line plate of [6], wherein the resin layer further includes an N-aromatic substituted maleimide group-containing compound.

The multilayered transmission line plate of any one of [1] to [7], wherein the fiber base material layer is a layer including a fiber base material and a resin composition, and a difference in dielectric constant between the fiber base material and the resin composition is 1.0 or less.

The multilayered transmission line plate of any one of [1] to [8], wherein the dielectric constant of the fiber base material is 5.0 or less.

A multilayered transmission line plate including one pair of ground layers, a differential wiring layer disposed between one ground layer and the other ground layer of the one pair of ground layers, an insulating layer (3-I) disposed between the differential wiring layer and the one ground layer, and an insulating layer (3-II) disposed between the differential wiring layer and the other ground layer, wherein the insulating layer (3-II) has two or more layers of an insulating layer (3-IIA) and an insulating layer (3-IIB) laminated on the insulating layer (3-IIA), the insulating layer (3-I) is a resin layer, the insulating layer (3-IIA) is a resin layer, and the insulating layer (3-IIB) is a fiber base material layer.

Advantageous Effects of Invention

In accordance with the present invention, provided is a multilayered transmission line plate which makes it possible to reduce a skew in the differential transmission without adopting a complicated process and which is excellent in handling properties.

BRIEF DESCRIPTION OF DRAWINGS

FIG. 1 is a schematic view showing weave textures of a glass cloth;

FIG. 2 is a schematic view showing a disposition example of a glass cloth and a differential wiring;

FIG. 3 is a schematic cross-sectional view showing a multilayered transmission line plate according to a first embodiment (Example 1) of the present invention;

FIG. 4 is a schematic cross-sectional view showing a multilayered transmission line plate according to a second embodiment (Example 7) of the present invention;

FIG. 5 is a schematic cross-sectional view showing a multilayered transmission line plate according to a third embodiment (Example 10) of the present invention;

FIG. 6 is a schematic cross-sectional view showing a conventional multilayered transmission line plate;

FIG. 7 is a schematic cross-sectional view showing a multilayered transmission line plate produced in Comparative Example 2 of the present invention; and FIG. 8 is a schematic cross-sectional view showing a multilayered transmission line plate produced in Comparative Example 3 of the present invention.

DESCRIPTION OF EMBODIMENTS

The numerical parameters set forth in the present specification and attached claims are approximations that can vary depending upon the desired properties to be obtained by one skilled in the art utilizing the teachings disclosed in the present specification. The recitation of numerical ranges by endpoints includes all numbers subsumed within that range (for example, 1 to 5 includes 1, 1.5, 2, 2.75, 3, 3.80, 4, and 5) and any range within that range.

Embodiments of the multilayered transmission line plate of the present invention are hereunder described in detail by reference to the accompanying drawings.

The "differential wiring" in the present disclosure also includes a conductor layer in the production process of a multilayered transmission line plate as long as it is a conductor layer having been subjected to circuit processing such that it functions as a differential wiring of the produced multilayered transmission line plate. Similarly, the "ground layer" also includes a conductor layer in the production process of a multilayered transmission line plate as long as it is a conductor layer such that it functions as a ground layer of the produced multilayered transmission line plate.

In addition, the dielectric constant in the present disclosure is a value measured in a 10 GHz band by a cavity perturbation method (perturbation method cavity resonator: CP531, manufactured by Kanto Electronic Application and Development Inc.).

Multilayered Transmission Line Plate]

A multilayered transmission line plate according to the present embodiment is, for example, used for high-speed digital transmission by a Gbps-order differential transmission system.

The multilayered transmission line plate of the present invention includes one pair of ground layers, a differential wiring layer disposed between one ground layer and the other ground layer of the one pair of ground layers, a first insulating portion disposed between the differential wiring layer and the one ground layer, and a second insulating portion disposed between the differential wiring layer and the other ground layer, wherein the first insulating portion has a resin layer, the first insulating portion or the second insulating portion has a fiber base material layer including a fiber base material, and a thickness of the first insulating portion is equal to or thinner than a thickness of the second insulating portion. The first insulating portion or the second insulating portion is not limited to a single layer, and may be of a structure of plural layers having plural insulating materials.

It may be considered with respect to the multilayered transmission line plate of the present invention that since a material not containing a fiber base material is used for a part of the insulating layers constituted of materials containing a fiber base material in a conventional multilayered transmission line plate, the heterogeneity of the dielectric constant is lightened, thereby reducing the skew.

<Ground Layer>

Although the ground layer is not particularly limited, materials which are applied for a conductive layer of a conventional printed wiring board or the like (for example, a metal foil, etc.) may be applied.

As the metal foil, for example, a copper foil, a nickel foil, an aluminum foil, and the like may be applied, and from the viewpoint of handling properties and costs, a copper foil is preferred. From the viewpoint of rust preventing properties, chemical resistance, and heat resistance, the metal foil also may include a barrier layer made of nickel, tin, zinc, chromium, molybdenum, cobalt, etc., formed therein. In addition, from the viewpoint of improving adhesiveness to the insulating layer, the metal foil may be subjected to a surface treatment, such as a surface roughing treatment, or a treatment with a silane coupling agent.

The metal foil to be applied for the ground layer may also be a commercially available metal foil. Examples of the commercially available metal foil include "F2-WS" (a trade name, manufactured by Furukawa Electric Co., Ltd., surface roughness Rz of roughened surface=2.0 μm), "FV-WS" (a trade name, manufactured by Furukawa Electric Co., Ltd., surface roughness Rz of roughened surface=1.5 μm), and "3ECVLP" (a trade name, manufactured by Mitsui Mining and Smelting Co., Ltd., surface roughness Rz of roughened surface=3.0 μm), all of which are a copper foil, and the like.

The ground layer may be of a single-layer structure composed of a single kind of a metal material or may be of a single-layer structure composed of plural metal materials. Furthermore, the ground layer may also be of a laminated structure in which plural metal layers having different materials from each other are laminated. In addition, the thickness of the ground layer is not particularly limited.

The ground layer may be formed by means of plating. Specifically, for example, the ground layer may be formed by subjecting the surface of the first insulating portion, the second insulating portion, or an adhesive resin layer provided thereon to electroless plating, electrolytic plating, or the like.

<Differential Wiring Layer>

The differential wiring layer is a layer disposed between one ground layer and the other ground layer of the one pair of ground layers, and is a layer having differential wiring. In the differential wiring layer, there may be a portion having no differential wiring, and this portion has the same material as the insulating layer described below, for example. In the present specification, the "thickness of the differential wiring layer" refers to the thickness of the differential wiring of the differential wiring layer.

The material that forms the differential wiring is not particularly limited, and for example, any material applicable for the ground layer may be used. The differential wiring may also be formed by means of plating.

<Resin Layer>

The first insulating portion has a resin layer. In the present specification, the 'resin layer' refers to a layer including no fiber base material or a layer including a fiber base material as long as the effect of the present invention is not impaired and including a resin.

Further, in the present specification, "including a resin" includes not only a case where the resin is included alone but also a case where the resin composition is included. In the present specification, the "resin" may be in any state of a monomer before curing, an oligomer in a semi-cured state (so-called B stage state), or a polymer after curing. Each component contained in the resin layer will be described below.

(Resin)

The resin included in the resin layer is not particularly limited, and examples thereof include a thermoplastic resin, a thermosetting resin, and a resin resulting from modifying a thermoplastic resin with a thermosetting resin. From the viewpoint of high frequency characteristics, low thermal expansion property, and heat resistance, a thermosetting resin is preferred.

Examples of the thermosetting resin include an epoxy resin, a cyanate ester resin, and a maleimide group-containing compound. They may be used singly or in combinations of two or more thereof. Among them, the maleimide group-containing compound is preferred, a compound having two or more maleimide groups in one molecule is more preferred, and a bismaleimide compound having two maleimide groups in one molecule is still more preferred, from the viewpoint of high frequency characteristics, low thermal expansion property, and heat resistance.

The maleimide group-containing compound is a compound containing a maleimide group, and from the viewpoint of satisfying both low dielectric property and low thermal expansion property, a compound containing one or more groups selected from (a1) a divalent group having at least two imide bonds (hereinafter, referred to as "structure (a1)") and (a2) a saturated or unsaturated divalent hydrocarbon group (hereinafter, referred to as "structure (a2)") is preferred, and a compound containing the structure (a1) and the structure (a2) are more preferred. Note that the maleimide group is not contained in the structure (a1).

Further, the structure (a2) may be contained in the structure (a1), and those containing the structure (a1) that contains the structure (a2) are also defined as "containing the structure (a1) and the structure (a2)" in the present embodiment.

Hereinafter, the maleimide group-containing compound containing the structure (a1) and the structure (a2) is also referred to as "(A) maleimide group-containing compound" or "component (A)".

[Component (A): Maleimide Group-Containing Compound Containing Structure (a1) and Structure (a2)]

Component (A) is a maleimide group-containing compound containing the structure (a1) and the structure (a2).

By using the component (A) in the resin layer, it is possible to obtain the first insulating portion having high frequency characteristic and high adhesiveness to a conductor.

The maleimide group of the component (A) may be bound to an aromatic ring or may be bound to an aliphatic chain. However, from the viewpoint of dielectric property, it is preferable that the maleimide group is bound to the aliphatic chain. That is, it is preferable that the component (A) is an N-aliphatic substituted maleimide group-containing compound.

The structure (a1) is a divalent group having at least two imide bonds, and a group represented by the following general formula (I) is exemplified.

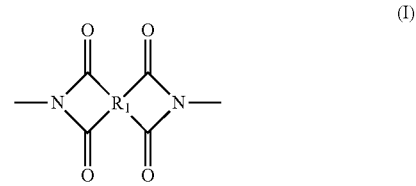

(I)

In the general formula (I), $R_1$ represents a tetravalent organic group. $R_1$ is not particularly limited as long as it is a tetravalent organic group, but the carbon number of $R_1$ may be 1 to 100, 2 to 50, or 4 to 30 from the viewpoint of handling property.

Examples of the tetravalent organic group represented by $R_1$ include an aliphatic hydrocarbon group, an alicyclic hydrocarbon group, an aromatic hydrocarbon group, and a hydrocarbon group having a siloxane skeleton. Examples of the hydrocarbon group having a siloxane skeleton include groups derived from dimethylsiloxane, methylphenylsiloxane, diphenylsiloxane, or the like.

The organic group represented by $R_1$ may be substituted with a substituent, and examples of the substituent include an alkyl group, an alkenyl group, an alkynyl group, a hydroxy group, an alkoxy group, a mercapto group, a cycloalkyl group, a substituted cycloalkyl group, a heterocyclic group, a substituted heterocyclic group, an aryl group, a substituted aryl group, a heteroaryl group, a substituted heteroaryl group, an aryloxy group, a substituted aryloxy group, a halogen atom, a haloalkyl group, a cyano group, a nitro group, a nitroso group, an amino group, an amide group, —C(=O)H, —NR$_x$C(=O)—N(R$_x$)$_2$, —OC(=O)—N(R$_x$)$_2$, an acyl group, an oxyacyl group, a carboxy group, a carbamate group, and a sulfonamide group. Here, R$_x$ represents a hydrogen atom or an alkyl group, and one kind of or two or more kinds of these substituents may be selected according to the purposes, applications and the like.

For example, R$_1$ is preferably a tetravalent residue of an acid anhydride having two or more anhydride rings in one molecule, that is, a tetravalent group obtained by removing two acid anhydride groups (—C(=O)OC(=O)—) from an acid anhydride. As the acid anhydride, an acid anhydride used in the preparation of the component (A) described later may be exemplified.

Among the above groups represented by R$_1$, R$_1$ is preferably an aromatic hydrocarbon group from the viewpoint of mechanical strength. Examples of the tetravalent aromatic hydrocarbon group include a benzenetetrayl group, a naphthalenetetrayl group, a biphenyltetrayl group, a diphenylethertetrayl group, and a 2,2-bis(4-phenoxyphenyl)propanetetrayl group. Among them, a benzenetetrayl group is preferred from the viewpoint of mechanical strength, and a diphenylethertetrayl group and a 2,2-bis(4-phenoxyphenyl)propanetetrayl group are preferred from the viewpoint of dielectric property.

The structure (a1) is preferably a group represented by the following formula (II-1) from the viewpoint of mechanical strength, and preferably a group represented by the following formula (II-2) or the following formula (II-3) from the viewpoint of dielectric property.

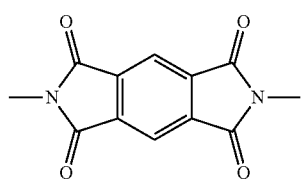
(II-1)

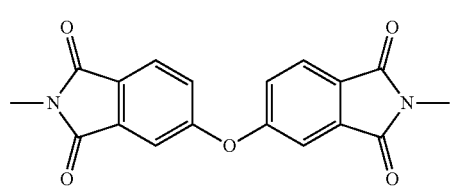
(II-2)

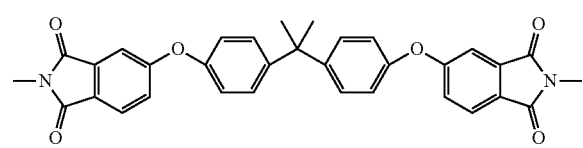
(II-3)

From the viewpoint of flowability and circuit embedding property, it is preferable that a plurality of structures (a1) are present in the component (A). In this case, the plurality of structures (a1) may be the same as or different from each other. The number of the structures (a1) contained in the component (A) is preferably 2 to 40, more preferably 2 to 20, and still more preferably 2 to 10.

The structure (a2) is a saturated or unsaturated divalent hydrocarbon group, and the hydrocarbon group may be linear, branched, or cyclic. When the component (A) contains the structure (a2), it is possible to improve the flexibility of the resin composition, and handling properties (tackiness, cracking, powder falling, etc.) and strength of a resin film produced from the resin composition.

The number of carbon atoms in the structure (a2) may be 8 to 100, 10 to 70, or 15 to 50.

Examples of the structure (a2) include a linear, branched, or cyclic divalent aliphatic hydrocarbon group, a divalent aromatic hydrocarbon group, and a divalent group formed by a combination thereof.

Examples of the divalent aliphatic hydrocarbon group include an alkylene group, a cycloalkylene group, an alkenylene group, a cycloalkenylene group, and a divalent group formed by a combination thereof. Among them, the alkylene group, the cycloalkylene group, and the divalent group formed by a combination thereof are preferred.

Examples of the alkylene group include an ethylene group, a propylene group, a butylene group, a pentylene group, a hexylene group, a heptylene group, an octylene group, a nonylene group, a decylene group, an undecylene group, a dodecylene group, a tetradecylene group, a hexadecylene group, an octadecylene group, and a nonadecylene group. Examples of the cycloalkylene group include a cyclohexylene group, a cycloheptylene group, a cyclooctylene group, a cyclononylene group, and a cyclodecylene group.

When the structure (a2) is an alkylene group, a cycloalkylene group, or a divalent group formed by a combination thereof, the number of carbon atoms thereof is preferably 8 to 100, more preferably 10 to 70, and still more preferably 15 to 50. The structure (a2) having the above carbon number is preferred because its molecular structure may be easily made to a three-dimensional structure and a free volume of the polymer may be increased, leading to low density, that is, low dielectric constant.

Examples of the divalent aromatic hydrocarbon group include a benzylene group, a phenylene group, and a naphthylene group, and examples of a combination of a divalent aliphatic hydrocarbon group and a divalent aromatic hydrocarbon group include arylene alkylene groups such as a phenylene methylene group, a phenylene ethylene group, a benzyl propylene group, a naphthylene methylene group, and a naphthylene ethylene group; and arylenealkylene groups such as a phenylenedimethylene group, and a phenylenediethylene group.

The structure (a2) is preferably a group represented by the following general formula (III) from the viewpoint of high frequency characteristics, low thermal expansion property, adhesiveness to a conductor, heat resistance, and low hygroscopic property.

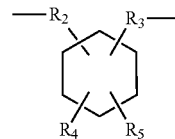
(III)

In the general formula (III), R$_2$ and R$_3$ each independently represent an alkylene group having 4 to 50 carbon atoms. From the viewpoint of further improvement of flexibility and easiness of synthesis, R$_2$ and R$_3$ are each independently preferably an alkylene group having 5 to 25 carbon atoms, more preferably an alkylene group having 6 to 10 carbon atoms, and still more preferably an alkylene group having 7 to 10 carbon atoms.

In the general formula (III), $R_4$ represents an alkyl group having 4 to 50 carbon atoms. From the viewpoint of further improvement of flexibility and easiness of synthesis, $R_4$ is preferably an alkyl group having 5 to 25 carbon atoms, more preferably an alkyl group having 6 to 10 carbon atoms, and still more preferably an alkyl group having 7 to 10 carbon atoms.

In the general formula (III), $R_5$ represents an alkyl group having 2 to 50 carbon atoms. From the viewpoint of further improvement of flexibility and easiness of synthesis, $R_5$ is preferably an alkyl group having 3 to 25 carbon atoms, more preferably an alkyl group having 4 to 10 carbon atoms, and still more preferably an alkyl group having 5 to 8 carbon atoms.

From the viewpoint of flowability and circuit embedding property, it is preferable that a plurality of structures (a2) are present in the component (A). In this case, the plurality of structures (a2) may be the same as or different from each other. The number of the structures (a2) contained in the component (A) is preferably 2 to 40, more preferably 2 to 20, and still more preferably 2 to 10.

A weight average molecular weight (Mw) of the component (A) is not particularly limited. However, from the viewpoint of flowability, the weight average molecular weight may be 500 or more, 1,000 or more, 1,500 or more, or 1,700 or more. From the viewpoint of handling property, the weight average molecular weight may be 10,000 or less, 9,000 or less, 7,000 or less, or 5,000 or less. The weight average molecular weight of the component (A) is preferably 500 to 10,000, more preferably 1,000 to 9,000, still more preferably 1,500 to 9,000, still much more preferably 1,500 to 7,000, and particularly preferably 1,700 to 5,000 from the viewpoint of handling property, flowability, and circuit embedding property.

The weight average molecular weight of the component (A) may be measured by gel permeation chromatography (GPC). Measurement conditions of GPC are as follows:

Pump: L-6200 Model [manufactured by Hitachi High-Technologies Corp.]

Detector: L-3300 Model RI [manufactured by Hitachi High-Technologies Corp.]

Column oven: L-655A-52 [manufactured by Hitachi High-Technologies Corp.]

Column: TSK Guardcolumn HHR-L, TSKgel G4000HHR, TSKgel G2000HHR [trade name, each of which is manufactured by Tosoh Corp.]

Column size: 6.0 mm×40 mm (guard), 7.8 mm×300 mm (column) Eluent: Tetrahydrofuran Sample concentration: 30 mg/5 mL Injection volume: 20 μL Flow rate: 1.00 mL/min Measurement temperature: 40° C.

A method of preparing the component (A) is not limited. The component (A) may be prepared, for example, by reacting an acid anhydride with a diamine to synthesize an amine-terminated compound, and then reacting the amine-terminated compound with an excessive amount of maleic anhydride.

Examples of the acid anhydride include pyromellitic anhydride, maleic anhydride, succinic anhydride, 3,3',4,4'-benzophenonetetracarboxylic dianhydride, 3,3',4,4'-biphenyltetracarboxylic dianhydride, and 3,3',4,4'-diphenylsulfonetetracarboxylic dianhydride. These acid anhydrides may be used singly or in combinations of two or more thereof according to the purposes, applications and the like. Here, as described above, $R_1$ of the above formula (I) may be tetravalent organic groups derived from acid anhydrides. From the viewpoint of better dielectric characteristics, it is preferable that the acid anhydride is pyromellitic anhydride.

Examples of the diamine include dimer diamines, 2,2-bis[4-(4-aminophenoxy)phenyl]propane, 1,3-bis(4-aminophenoxy)benzene, 4,4'-bis(4-aminophenoxy)biphenyl, 4,4'-diamino-3,3'-dihydroxybiphenyl, 1,3-bis[(2-(4-aminophenyl)-2-propyl]benzene, 1,4-bis[(2-(4-aminophenyl)-2-propyl]benzene, polyoxyalkylenediamines, [3,4-bis(1-aminoheptyl)-6-hexyl-5-(1-octenyl)]cyclohexene, and [1,2-bis(1-aminooctyl)-3-octyl-4-hexyl]cyclohexane. These may be used singly or in combinations of two or more thereof according to the purposes, applications and the like.

The component (A) may be, for example, a compound represented by the following general formula (IV).

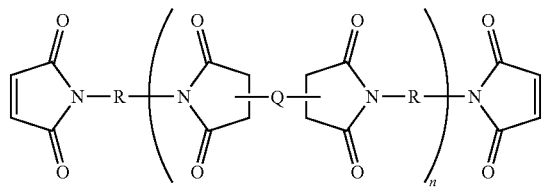

(IV)

In the general formula (IV), R and Q each independently represent a divalent organic group, and n represents an integer of 1 to 10.

As the divalent organic group represented by R in the general formula (IV), the same divalent groups as those mentioned in the structure (a2) may be exemplified, and the preferred embodiments are also applicable to R.

As the divalent organic group represented by Q in the general formula (IV), the same groups as those mentioned in the $R_1$ may be exemplified, and the preferred embodiments are also applicable to Q.

As the component (A), commercially available compounds may also be used. Examples of the commercially available compound include "BMI-1500", "BMI-1700", "BMI-3000", "BMI-5000", "BMI-9000" (any of which is a trade name) manufactured by Designer Molecules Inc. Among them, "BMI-3000" is preferred from the viewpoint of acquiring better high-frequency characteristics.

Further, estimated structures of the above-mentioned commercially available compounds are as follows.

BMI-1500: the following general formula (V-1)

BMI-1700: the following general formula (V-2)

BMI-3000, BMI-5000, and BMI-9000: any of them has a structure of the following general formula (V-3), and they are different from each other in the weight average molecular weight.

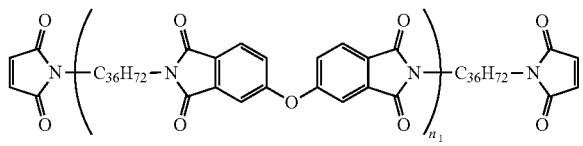

(V-1)

(In the formula, $n_1$ represents an integer of 1 to 10.)

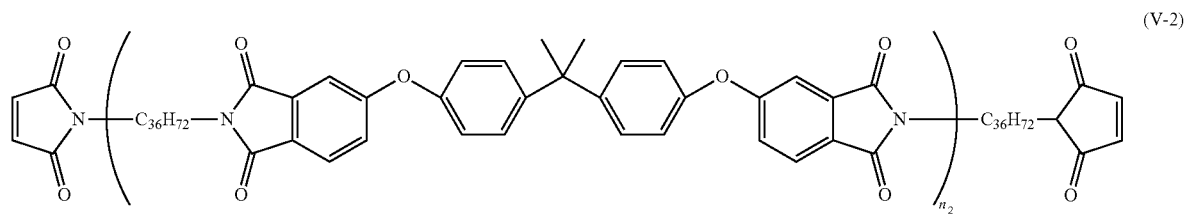

(V-2)

(In the formula, $n_2$ represents an integer of 1 to 10.)

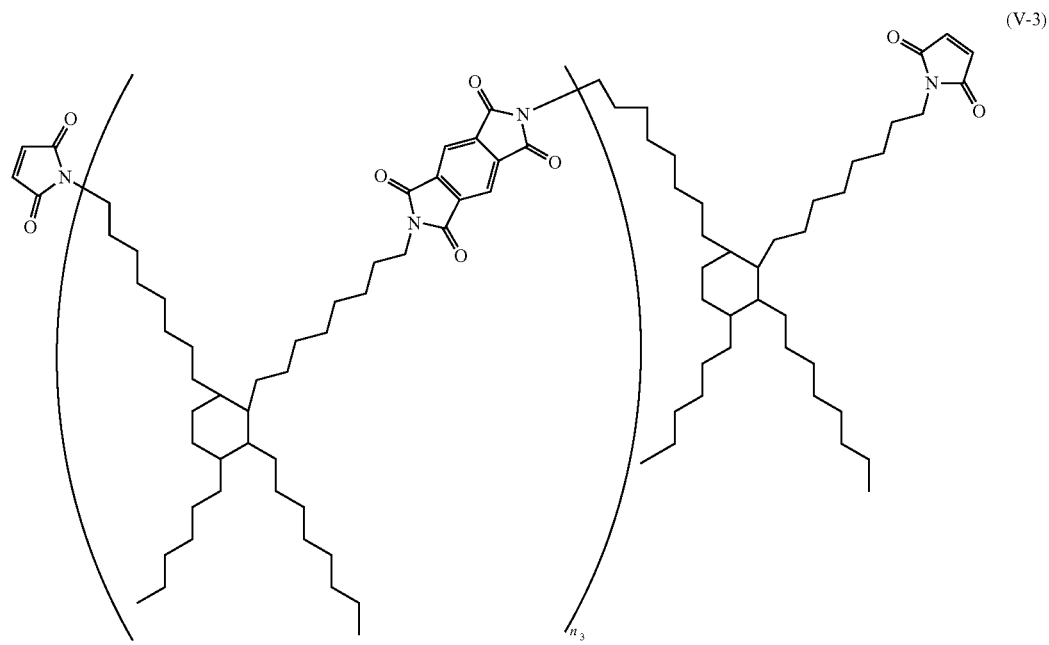

(V-3)

(In the formula, $n_3$ represents an integer of 1 to 10.)

The content of the component (A) in the resin composition is not particularly limited. From the viewpoint of the heat resistance, the content of the component (A) may be 2% by mass or more, or 10% by mass or more, based on the total mass of the solid content of the resin composition. From the viewpoint of the low thermal expansion coefficient, the content of the component (A) may be 98% by mass or less, 50% by mass or less, or 30% by mass or less, based on the total mass of the solid content of the resin composition. From the viewpoint of the heat resistance and the low thermal expansion coefficient, the content of the component (A) may be preferably 2% by mass to 98% by mass, more preferably 10% by mass to 50% by mass, and most preferably 10% by mass to 30% by mass, based on the total mass of the solid content of the resin composition.

The solid content in the present embodiment refers to components in the composition other than water and a volatile substance such as a solvent, as described below. In other words, the solid content includes those in a liquid state, in a syrup state, and in a waxy state at room temperature around 25° C., and does not necessarily mean solid components.

The resin composition of the present embodiment may include one kind of the component (A) or two or more kinds of the component (A).

When the resin composition includes two or more kinds of the component (A), from the viewpoint of satisfying both low dielectric property and low thermal expansion property, it is preferable that one component (A) and the other component (A) having a lower thermal expansion coefficient than the one component (A) are used in combination. In this case, it is preferable that the other component (A) has a lower molecular weight, more aromatic rings, or a shorter main chain than the one component (A).

[Component (B): Maleimide Group-Containing Compound]

The resin composition of the present embodiment may include a maleimide group-containing compound (hereinafter, referred to as "(B) maleimide group-containing compound" or "component (B)") besides the component (A), and preferably include both the component (A) and the component (B).

It is preferable that the component (B) has a thermal expansion coefficient lower than that of the component (A). By using the component (A) in combination with the component (B) having a thermal expansion coefficient lower than that of the component (A), it is possible to further improve low thermal expansion property and the like while maintaining excellent dielectric properties. The reason therefor appears to be because a cured product obtained from the resin composition containing the component (A) and the component (B) contains a polymer having a structural unit derived from the component (A) having low dielectric characteristics and a structural unit derived from the component (B) having low thermal expansion property.

The content of the component (B) in the resin composition is not particularly limited. However, from the viewpoint of the low thermal expansion property, the content of the component (B) may be 1% by mass or more, 3% by mass or more, or 4% by mass or more with respect to the total mass of the solid content of the resin composition. Further, from the viewpoint of the dielectric characteristics, the content of the component (B) may be 50% by mass or less, 30% by mass or less, or 10% by mass or less with respect to the total mass of the solid content of the resin composition. Furthermore, from the viewpoint of the low thermal expansion property and dielectric characteristics, the content of the component (B) is preferably 1% by mass to 50% by mass, more preferably 3% by mass to 30% by mass, and still more preferably 5% by mass to 10% by mass with respect to the total mass of the solid content of the resin composition.

The blending proportion of the component (A) and the component (B) in the resin composition is not particularly limited. From the viewpoint of the dielectric characteristics and the low thermal expansion coefficient, a mass ratio [(B)/(A)] of the component (A) and the component (B) is preferably 0.01 to 3, more preferably 0.03 to 2, and still more preferably 0.05 to 1.

The component (B) is not particularly limited, but preferably a compound having an aromatic ring. Since the aromatic ring is rigid and low in the thermal expansion, use of the component (B) having an aromatic ring can further reduce the thermal expansion coefficient.

Although the maleimide group of the component (B) may be bound to an aromatic ring or an aliphatic chain, from the viewpoint of the dielectric characteristics, the maleimido group is preferably bound to an aromatic ring. That is, the component (B) is preferably an N-aromatic substituted maleimide group-containing compound.

Further, the component (B) is preferably a polymaleimide compound containing two or more maleimide groups, and more preferably a bismaleimide compound containing two maleimide groups.

The compound (B) may be, for example, a compound represented by the following general formula (VI).

(VI)

In the general formula (VI), $A_2$ represents a divalent group represented by the following general formula (VI-1), (VI-2), (VI-3) or (VI-4).

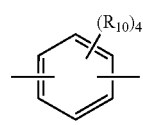
(VI-1)

In the general formula (VI-1), $R_{10}$ each independently represents a hydrogen atom, an aliphatic hydrocarbon group having 1 to 5 carbon atoms, or a halogen atom.

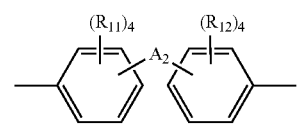
(VI-2)

In the general formula (VI-2), $R_{11}$ and $R_{12}$ each independently represent a hydrogen atom, an aliphatic hydrocarbon group having 1 to 5 carbon atoms, or a halogen atom, $A_2$ represents an alkylene group or alkylidene group having 1 to 5 carbon atoms, an ether group, a sulfide group, a sulfonyl group, a ketone group, a single bond, or a group represented by the following general formula (VI-2').

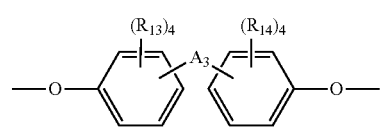
(VI-2')

In the general formula (VI-2'), $R_{13}$ and $R_{14}$ each independently represent a hydrogen atom, an aliphatic hydrocarbon group having 1 to 5 carbon atoms, or a halogen atom, $A_3$ represents an alkylene group or alkylidene group having 1 to 5 carbon atoms, an ether group, a sulfide group, a sulfonyl group, a ketone group, or a single bond.

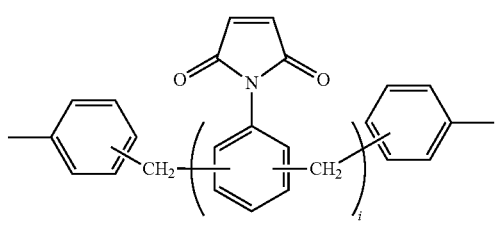
(VI-3)

In the general formula (VI-3), i is an integer of 1 to 10.

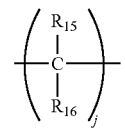
(VI-4)

In the general formula (VI-4), $R_{15}$ and $R_{16}$ each independently represent a hydrogen atom or an aliphatic hydrocarbon group having 1 to 5 carbon atoms, and j is an integer of 1 to 8.

Examples of the aliphatic hydrocarbon group having 1 to 5 carbon atoms represented by any one of $R_{10}$ in the general formula (VI-1), $R_{11}$ and $R_{12}$ in general formula (VI-2), $R_{13}$ and $R_{14}$ in general formula (VI-2'), and $R_{15}$ and $R_{16}$ in general formula (VI-4) include a methyl group, an ethyl group, an n-propyl group, an isopropyl group, an n-butyl group, an isobutyl group, a t-butyl group, and an n-pentyl group. The aliphatic hydrocarbon may be an aliphatic hydrocarbon group having 1 to 3 carbon atoms or a methyl group.

Examples of the alkylene group having 1 to 5 carbon atoms represented by A2 in the general formula (VI-2) or $A_3$ in the general formula (VI-2') include a methylene group, an ethylene group, a propylene group, a butylene group, and a pentylene group.

Examples of the alkylidene group having 1 to 5 carbon atoms represented by A2 in formula (VI-2) or $A_3$ in formula (VI-2') include an ethylidene group, a propylidene group, an isopropylidene group, a butylidene group, an isobutylidene group, and a pentylidene group.

Specific examples of the component (B) include 1,2-dimaleimidoethane, 1,3-dimaleimidopropane, bis(4-maleimidophenyl)methane, bis(3-ethyl-4-maleimidophenyl)methane, bis(3-ethyl-5-methyl-4-maleimidophenyl)methane, 2,7-dimaleimidofluorene, N,N'-(1,3-phenylene)bismaleimide, N,N'-[1,3-(4-methylphenylene)bismaleimide, bis(4-maleimidophenyl)sulfone, bis(4-maleimidophenyl) sulfide, bis(4-maleimidophenyl) ether, 1,3-bis(3-maleimidophenoxy)benzene, 1,3-bis[3-(3-maleimidophenoxy)phenoxy]benzene, bis(4-maleimidophenyl) ketone, 2,2-bis[4-(4-maleimidophenoxy)phenyl]propane, bis[4-(4-maleimidophenoxy)phenyl]sulfone, bis[4-(4-maleimidophenoxy)phenyl] sulfoxide, 4,4'-bis(3-maleimidophenoxy)biphenyl, 1,3-bis[2-(3-maleimidophenyl)propyl]benzene, 1,3-bis(1-[4-(3-maleimidophenoxy)phenyl]-1-propyl)benzene, bis(maleimidocyclohexyl)methane, 2,2-bis[4-(3-maleimidophenoxy)phenyl]-1,1,1,3,3,3-hexafluoropropane, and bis(maleimidophenyl)thiophene. These may be used singly or in combinations of two or more thereof. Among them, from the viewpoint of further reducing the hygroscopic property and the thermal expansion coefficient, bis (3-ethyl-5-methyl-4-maleimidophenyl)methane and bis(4-maleimidophenyl)methane are preferred. From the viewpoint of further enhancing the breaking strength of a resin film formed from the resin composition and the metal foil peel strength, 2,2-bis[4-(4-maleimidophenoxy)phenyl] propane and bis(4-maleimidophenyl)methane are preferred.

[Component (C): Thermosetting Resin Different from Component (A) and Component (B)]

The resin composition of the present embodiment may further include a thermosetting resin (C) (hereinafter, also referred to as "Component (C)") different from the component (A) and the component (B). The low thermal expansion property or the like of the resin composition may be further improved by including the thermosetting resin (C).

Examples of the thermosetting resin (C) include an epoxy resin, and a cyanate ester rein.

The epoxy resin is not particularly limited, but examples thereof include bisphenol A epoxy resins, bisphenol F epoxy resins, bisphenol S epoxy resins, alicyclic epoxy resins, aliphatic chain epoxy resins, phenol novolac epoxy resins, cresol novolac epoxy resins, bisphenol A novolac epoxy resins, phenol aralkyl epoxy resins, naphthalene skeleton-containing epoxy resins, bifunctional biphenyl epoxy resins, biphenyl aralkyl epoxy resins, dicyclopentadiene epoxy resins, and dihydroanthracene epoxy resins. These may be used singly or in combinations of two or more thereof. Among them, from the viewpoint of the high-frequency characteristics and the thermal expansion characteristics, a naphthalene skeleton-containing epoxy resin or a biphenyl aralkyl epoxy resin are preferred. The naphthalene skeleton-containing epoxy resin may include a naphthol novolac type epoxy resin, and a naphthol aralkyl type epoxy resin.

The cyanate ester resin is not particularly limited, but examples thereof may include 2,2-bis(4-cyanatophenyl)propane, bis(4-cyanatophenyl)ethane, bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropylbenzene, cyanate ester compounds of phenol-added dicyclopentadiene polymers, phenol novolac cyanate ester compounds, and cresol novolac cyanate ester compounds. These may be used singly or in combinations of two or more thereof. Among them, in consideration of the inexpensiveness and the overall balance of the high frequency characteristics and other characteristics, 2,2-bis(4-cyanatophenyl)propane is preferred.

A content of the component (C) in the resin composition is not particularly limited. However, from the viewpoint of the low thermal expansion property, the content of the component (C) is preferably 1% by mass to 40% by mass, more preferably 2% by mass to 20% by mass, and still more preferably 3% by mass to 10% by mass based on the total mass of the solid content of the resin composition.

The resin composition of the present embodiment may further include a curing agent of the thermosetting resin (C). The addition thereof enables a curing reaction of the resin composition to be smoothly advanced, and physical properties of the obtained cured product of the resin composition to be suitably regulated.

In the case of using the epoxy resin, the curing agent is not particularly limited, but examples thereof include polyamine compounds such as diethylenetriamine, triethylenetetramine, diaminodiphenylmethane, m-phenylenediamine, and dicyandiamide; polyphenol compounds such as bisphenol A, phenol novolac resins, cresol novolac resins, bisphenol A novolac resins, and phenol aralkyl resins; acid anhydrides such as phthalic anhydride, and pyromellitic anhydride; various carboxylic acid compounds; and various active ester compounds. These may be used singly or in combinations of two or more thereof.

In the case of using the cyanate ester resin, the curing agent is not particularly limited, but examples thereof include various monophenol compounds, various polyphenol compounds, various amine compounds, various alcohol compounds, various acid anhydrides, and various carboxylic acid compounds. These may be used singly or in combinations of two or more thereof.

The resin composition of the present embodiment may further include a curing accelerator according to the kind of the thermosetting resin (C). Examples of the curing accelerator of the epoxy resin include various types of imidazoles, BF3 amine complexes, and phosphorus-containing curing accelerators, which are latent heat curing agents. From the viewpoint of storage stability of the resin composition, and the handling properties and the solder heat resistance of the semi-cured resin composition, imidazoles and phosphorus-containing curing accelerators are preferred. These may be used singly or in combinations of two or more thereof.

In the case where the resin composition of the present embodiment contains the epoxy resin and the curing accelerator of the epoxy resin, a content of the curing accelerator of the epoxy resin may be 0.1 parts by mass to 10 parts by mass, or 1 part by mass to 5 parts by mass with respect to 100 parts by mass of the solid content of the epoxy resin.

[Component (D): One or More Selected from Compound Represented by General Formula (VII) and Polyaminobismaleimide Compound]

From the viewpoint of the moldability, the resin composition of the present embodiment may include one or more (D) (hereinafter, referred to as "component (D)") selected from a compound represented by the following general formula (VII) and a polyaminobismaleimide compound.

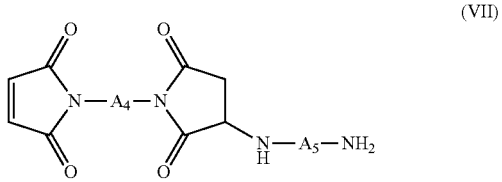

In the general formula (VII), $A_4$ is the same as $A_1$ in the general formula (VI). $A_5$ is a group represented by the following formula (VII-1).

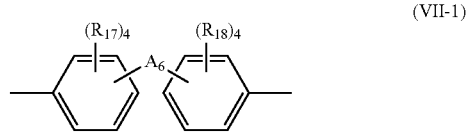

In the formula (VII-1), $R_{17}$ and $R_{18}$ each independently represent a hydrogen atom, an aliphatic hydrocarbon group having 1 to 5 carbon atoms, an alkoxy group having 1 to 5 carbon atoms, a hydroxy group, or a halogen atom, and $A_6$ represents an alkylene group or alkylidene group having 1 to 5 carbon atoms, an ether group, a sulfide group, a sulfonyl group, a ketone group, a fluorenylene group, a single bond, a group represented by the following formula (VII-1'), or a group represented by the following formula (VII-1").

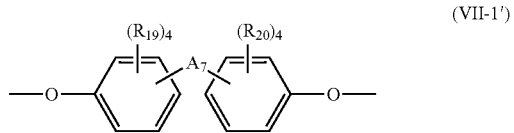

In the formula (VII-1'), $R_{19}$ and $R_{20}$ each independently represent a hydrogen atom, an aliphatic hydrocarbon group having 1 to 5 carbon atoms, or a halogen atom, and $A_7$ represents an alkylene group having 1 to 5 carbon atoms, an isopropylidene group, an m-phenylenediisopropylidene group, a p-phenylene diisopropylidene group, an ether group, a sulfide group, a sulfonyl group, a ketone group, or a single bond.

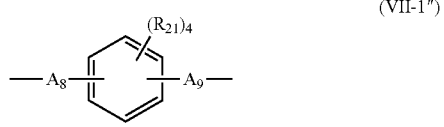

In the formula (VII-1"), $R_{21}$ each independently represents a hydrogen atom, an aliphatic hydrocarbon group having 1 to 5 carbon atoms, or a halogen atom, and $A_8$ and $A_9$ each independently represent an alkylene group having 1 to 5 carbon atoms, an isopropylidene group, an ether group, a sulfide group, a sulfonyl group, a ketone group, or a single bond.

Examples of the polyaminobismaleimide compound include those obtained by subjecting a bismaleimide compound having two N-substituted maleimide groups in a molecule and an aromatic diamine compound having two primary amino groups in a molecule to a Michael addition reaction in an organic solvent.

The bismaleimide compound having two N-substituted maleimide groups in a molecule is preferably one or more selected from the bismaleimide compounds exemplified as the component (A) and the bismaleimide compounds exemplified as the component (B), more preferably bismaleimide compounds exemplified as the component (B), and still more preferably the compounds represented by the formula (VI). Among them, one or more selected from 2,2-bis[4-(4-maleimidophenoxy)phenyl]propane and 3,3'-dimethyl-5,5'-diethyl-4,4'-diphenylmethane bismaleimide are particularly preferred.

The aromatic diamine compound having two primary amino groups in a molecule is not particularly limited, but examples thereof include 4,4'-diaminodiphenylmethane, 4,4'-diamino-3,3'-dimethyl-diphenylmethane, 2,2'-dimethyl-4,4'-diaminobiphenyl, 2,2-bis[4-(4-aminophenoxy)phenyl]propane, 4,4'-[1,3-phenylenebis(1-methylethylidene)]bisaniline, and 4,4'-[1,4-phenylenebis(1-methylethylidene)]bisaniline. These may be used singly or in combinations of two or more thereof. From the viewpoint of increasing solubility for organic solvents, a reaction rate during synthesis, and heat resistance, 4,4'-diaminodiphenylmethane, 4,4'-diamino-3,3'-dimethyl-diphenylmethane, and 4,4'-[1,3-phenylenebis(1-methylethylidene)]bisaniline are preferred The organic solvent to be used at the time of preparing the polyaminobismaleimide compound is not particularly limited, but examples thereof include alcohols such as methanol, ethanol, butanol, butyl cellosolve, ethylene glycol monomethyl ether, and propylene glycol monomethyl ether; ketones such as acetone, methyl ethyl ketone, methyl isobutyl ketone, and cyclohexanone; aromatic hydrocarbons such as toluene, xylene, and mesitylene; esters such as methoxyethyl acetate, ethoxyethyl acetate, butoxyethyl acetate, and ethyl acetate; and nitrogen-containing compounds such as N,N-dimethylformamide, N,N-dimethylacetamide, and N-methyl-2-pyrrolidone. These may be used singly or in combination of two or more thereof. Among them, methyl ethyl ketone, cyclohexanone, propylene glycol monomethyl ether, N,N-dimethylformamide and N,N-dimethylacetamide are preferred from the viewpoint of the solubility.

[Component (E): Thermoplastic Resin]

The resin composition of the present embodiment, from the viewpoint of increasing the handling properties of the resin film, may further include a thermoplastic resin (E) (hereinafter, referred to as "component (E)"). A kind of the thermoplastic resin (E) is not particularly limited, and a molecular weight thereof also is not limited. However, from the viewpoint of enhancing the compatibility with the component (A), it is preferable that a number-average molecular weight (Mn) thereof is 200 to 60,000. The number average molecular weight of the component (E) may be determined in terms of polystyrene using the GPC method.

[Component (F): Resin Resulting from Modifying Thermoplastic Resin with Thermosetting Resin]

The resin composition of the present embodiment, from the viewpoint of improving dielectric properties, heat resistance, solvent resistance, and press moldability, may include a resin resulting from modifying a thermoplastic resin with a thermosetting resin (F) (hereinafter, referred to as "component (F)").

The component (F) may be a polyphenylene ether derivative having at least one N-substituted maleimide group in a molecule (hereinafter, also referred to as "polyphenylene ether derivative (f)").

The polyphenylene ether derivative (f) preferably has a group containing at least one N-substituted maleimide structure in a molecule and a structural unit represented by the following general formula (VIII).

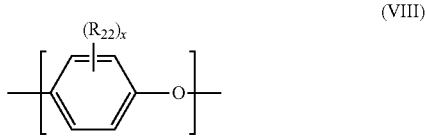

(VIII)

In the general formula (VIII), $R_{22}$ represents each independently an aliphatic hydrocarbon group having 1 to 5 carbon atoms or a halogen atom. X is an integer of 0 to 4.

Examples of the aliphatic hydrocarbon group represented by $R_{22}$ include a methyl group, an ethyl group, an n-propyl group, an isopropyl group, an n-butyl group, an isobutyl group, a t-butyl group, and an n-pentyl group. The aliphatic hydrocarbon may be an aliphatic hydrocarbon group having 1 to 3 carbon atoms or a methyl group. Examples of the halogen atom include a fluorine atom, a chlorine atom, a bromine atom, and an iodine atom.

x is an integer of 0 to 4, and may be an integer of 0 to 2, or 2. In the case where x is 1 or 2, $R_{22}$ may be substituted at the ortho position (based on the substitution position of the oxygen atom) on the benzene ring.

The structural unit represented by the general formula (VIII) is preferably a structural unit represented by the following general formula (VIII').

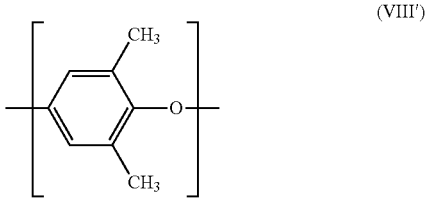

(VIII')

From the viewpoint of high-frequency properties, adhesiveness to a conductor, heat resistance, glass transition temperature, thermal expansion coefficient, and flame retardancy, the N-substituted maleimide structure-containing group may be a group containing a bismaleimide structure in which the nitrogen atoms of the two maleimide groups are bound to each other via an organic group, and may also be a group represented by the following general formula (IX).

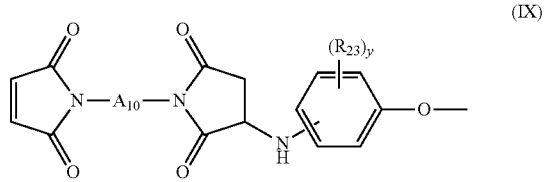

(IX)

In the general formula (IX), $A_{10}$ is the same as $A_1$ in the general formula (VI). $R_{23}$ each independently is an aliphatic hydrocarbon group having 1 to 5 carbon atoms or a halogen atom. y is an integer of 0 to 4.

As for the aliphatic hydrocarbon group having 1 to 5 carbon atoms and the halogen atom, as represented by $R_{23}$, the same explanation as in the case of $R_{22}$ is applicable. y is an integer of 0 to 4, and may be an integer of 0 to 2 and may also be 0.

The polyphenylene ether derivative (f) may be, for example, obtained by the following preparation method. The polyphenylene ether derivative (f) may be prepared by first subjecting an aminophenol compound represented by the following general formula (X) and a polyphenylene ether, for example, having a number average molecular weight of 15,000 to 25,000 to a known redistribution reaction in an organic solvent, thereby preparing a polyphenylene ether compound (f') having a primary amino group in a molecule while being accompanied with molecular weight reduction of the polyphenylene ether, and subsequently subjecting the polyphenylene ether compound (f') and a bismaleimide compound to a Michael addition reaction.

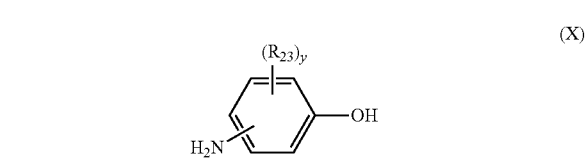

(X)

In the general formula (X), $R_{23}$ and y are the same as those in the general formula (IX).

Examples of the aminophenol compound include o-aminophenol, m-aminophenol, and p-aminophenol.

A number average molecular weight of the polyphenylene ether is preferably 5,000 to 40,000, more preferably 10,000 to 30,000, and still more preferably 13,000 to 20,000. The number average molecular weight of the polyphenylene ether may be determined in terms of polystyrene using the GPC method.

The bismaleimide compound is preferably one or more selected from the bismaleimide compounds exemplified as the component (A) and the bismaleimide compounds exemplified as the component (B), more preferably the bismaleimide compounds exemplified as the component (B), and still more preferably the compounds represented by the general formula (VI). Among them, 2,2-bis[4-(4-maleimidephenoxy)phenyl]propane is particularly preferred.

The polyphenylene ether derivative (f) is obtained by charging predetermined amounts of the aforementioned bismaleimide compound and optionally, a reaction catalyst, etc. in a solution of the polyphenylene ether compound (f'), and undergoing a Michael addition reaction while heating, keeping the temperature, and stirring. As for reaction conditions in this process, from the viewpoint of workability and gelation inhibition, for example, the reaction temperature may be in a range of 50° C. to 160° C., and the reaction time may be in a range of 1 hour to 10 hours.

The polyphenylene ether derivative (f) thus obtained has preferably a structure represented by the following general formula (XI).

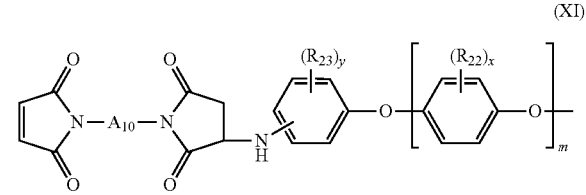

(XI)

In the formula (XI), $A_{10}$, $R_{23}$ and y are the same as those in the general formula (IX), $R_{22}$ and x are the same as those in the general formula (VIII). m is an integer of 1 or more.

(Catalyst)

The resin composition of the present embodiment may further include a catalyst to promote curing of the component (A). A content of the catalyst is not particularly limited, but may be 0.1% by mass to 5% by mass based on the total mass of the solid content of the resin composition. Examples of the catalyst include peroxides, and azo compounds.

Examples of the peroxide include dicumyl peroxide, dibenzoyl peroxide, 2-butanone peroxide, tert-butyl perbenzoate, di-tert-butyl peroxide, 2,5-dimethyl-2,5-di(t-butylperoxy)hexane, bis(tert-butylperoxyisopropyl)benzene, and tert-butyl hydroperoxide. Examples of the azo compound my include 2,2'-azobis(2-methylpropanenitrile), 2,2'-azobis(2-methylbutanenitrile), and 1,1'-azobis(cyclohexanecarbonitrile). These may be used singly or in combination of two or more thereof.

(Inorganic Filler)

The resin composition of the present embodiment may further include an inorganic filler. When an appropriate inorganic filler, which is optional, is incorporated, the low thermal expansion property, the high elastic modulus property, the heat resistance, the flame retardancy and the like of the resin composition may be improved. The inorganic filler is not particularly limited, but examples thereof include silica, alumina, titanium oxide, mica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, calcined clay, talc, aluminum borate, and silicon carbide. These may be used singly or in combinations of two or more thereof.

A shape and a particle diameter of the inorganic filler are not particularly limited. The particle diameter of the inorganic filler may be, for example, 0.01 μm to 20 μm or 0.1 μm to 10 μm. Here, the particle diameter refers to a volume average particle diameter, and is a particle diameter at the point corresponding to 50% in volume when a cumulative frequency distribution curve of particle diameters is determined with the total volume of the particles being taken to be 100%. The average particle diameter may be measured by a particle size distribution analyzer using a laser diffraction scattering method, or the like.

In the case of using the inorganic filler, a use volume thereof is not particularly limited. However, for example, a content ratio of the inorganic filler is preferably 3% by volume to 75% by volume, and more preferably 5% by volume to 70% by volume with respect to the total volume of the solid content of the resin composition. In the case where the content ratio of the inorganic filler in the resin composition is in the above range, it is easy to obtain good curability, moldability, and chemical resistance.

In the case of using the inorganic filler, a coupling agent may be used in combination as required, for the purpose of improving the dispersibility of the inorganic filler, adhesiveness to organic components, and the like. The coupling agent is not particularly limited, and for example, various types of silane coupling agents, titanate coupling agents and the like may be used. These may be used singly or in combinations of two or more thereof. An amount of the coupling agent to be used is also not particularly limited, and it may be used, for example, in an amount of 0.1% by mass to 5% by mass or 0.5% by mass to 3% by mass with respect to 100% by mass of the inorganic filler to be used. Within this range, deterioration in various characteristics is small and it is easy to effectively exhibit characteristics of using the inorganic filler.

In the case of using the coupling agent, a so-called integral blending system may be used, in which the inorganic filler is blended in the resin composition, and then the coupling agent is added thereto. However, it is preferable to use a system in which the inorganic filler previously surface-treated in dry or wet with the coupling agent is used. By using this method, characteristics of the above inorganic filler can be more effectively developed.

(Flame Retardant)

The resin composition of the present embodiment may further include a flame retardant. The flame retardant is not particularly limited, but bromine-based flame retardants, phosphorus-based flame retardants, metal hydroxides, and the like are preferably used. The bromine-based flame retardants may include brominated epoxy resins such as brominated bisphenol A epoxy resins, and brominated phenol novolac epoxy resins; bromination addition-type flame retardants such as hexabromobenzene, pentabromotoluene, ethylenebis(pentabromophenyl), ethylenebistetrabromophthalimide, 1,2-dibromo-4-(1,2-dibromoethyl)cyclohexane, tetrabromocyclooctane, hexabromocyclododecane, bis(tribromophenoxy)ethane, brominated polyphenylene ethers, brominated polystyrenes, and 2,4,6-tris(tribromophenoxy)-1,3,5-triazine; and bromination reaction-type flame retardants containing an unsaturated double bond group such as tribromophenylmaleimide, tribromophenyl acrylate, tribromophenyl methacrylate, tetrabromobisphenol A dimethacrylate, pentabromobenzyl acrylate, and brominated styrene. These may be used singly or in combinations of two or more thereof.

The phosphorus-based flame retardants may include aromatic phosphate esters such as triphenyl phosphate, tricresyl phosphate, trixylenyl phosphate, cresyl diphenyl phosphate, cresyl di-2,6-xylenyl phosphate and resorcinol bis(diphenylphosphate); phosphonate esters such as divinyl phenylphosphonate, diallyl phenylphosphonate, and bis(1-butenyl) phenylphosphonate; phosphinate esters such as phenyl diphenylphosphinate, methyl diphenylphosphinate, and 9,10-dihydro-9-oxa-10-phosphaphenanthrene-10-oxide derivatives; phosphazene compounds such as bis(2-allylphenoxy)phosphazene, dicresylphosphazene; and other phosphorus-based flame retardants such as melamine phosphate, melamine pyrophosphate, melamine polyphosphate, melam polyphosphate, ammonium polyphosphate, phosphorus-containing vinylbenzyl compounds, and red phosphorus. The metal hydroxide flame retardants may include magnesium hydroxide, aluminum hydroxide and the like. These flame retardants may be used singly or in combinations of two or more thereof.

(Preparation Method of Resin Composition)

The resin composition of the present embodiment may be obtained by homogeneously dispersing and mixing the above-mentioned respective components, and its preparation method, conditions and the like are not particularly limited. The method may be exemplified by a method in which predetermined blending amounts of the respective components are fully and homogeneously stirred and mixed by a mixer or the like, and then kneaded by using a mixing roll, an extrusion machine, a kneader, a roll, an extruder, or the like, and further, the obtained kneaded material is cooled and crushed. In addition, the kneading form is not particularly limited.

A method of forming the resin layer is not particularly limited, but the resin layer may be formed by, for example, producing a resin film from the resin composition and laminating it. A method of producing the resin film is as described later.

The relative dielectric constant of a cured product of the resin composition of the present embodiment is not particularly limited. However, from the viewpoint of being suitably used in a high-frequency band, the relative dielectric constant at 10 GHz is preferably 3.6 or less, more preferably 3.1 or less, and still more preferably 3.0 or less. The lower limit of the relative dielectric constant is not particularly limited, but may be, for example, about 1.0. Further, from the viewpoint of being suitably used in a high-frequency band, the dielectric loss tangent of the cured product of the resin composition of the present embodiment is preferably 0.004 or less, and more preferably 0.003 or less. A lower limit of the dielectric loss tangent is not particularly limited, but may be, for example, about 0.0001. The relative dielectric constant and the dielectric loss tangent may be measured by methods shown in Examples.

<Fiber Base Material Layer>

The second insulating portion has a fiber base material layer. In the present specification, the "fiber base material layer" means a layer including a fiber base material and a resin.

The fiber base material layer may be a layer including a fiber base material and a resin composition. The resin composition included in the fiber base material layer is not particularly limited as long as it includes the resin, and may further include other components such as the inorganic filler, the flame retardant, and various additives, as needed.

(Fiber Base Material)

The fiber base material is not particularly limited, and those obtained by weaving yarns in a high density or opened fiber yarns (opened yarns) are preferred from the viewpoint of further reducing the heterogeneity of the dielectric constant.

Examples of the material of the fiber base material include natural fibers such as paper, and cotton linters; inorganic fibers such as glass fiber, and asbestos; organic fibers such as aramid, polyimide, polyvinyl alcohol, polyester, polytetrafluoroethylene, and acrylic; and mixtures thereof. Of them, glass fiber is preferred from the viewpoint of further reducing the heterogeneity of the dielectric constant.

As the glass fiber, a glass cloth using E glass, NE glass, D glass, or Q glass is preferred. When a glass cloth in which glass fiber yarns having a dielectric constant close to the resin to be impregnated are used for the warp and the weft is used, the heterogeneity of the dielectric constant can be further reduced. Further, when glass fiber yarns of the same kind are used for the warp and the weft, the heterogeneity of the dielectric constant can be further reduced as well.

From the viewpoint of reducing the heterogeneity of the dielectric constant, the dielectric constant of the fiber base material is preferably 5.0 or less, and more preferably 4.5 or less.

The resin or the resin composition included in the fiber base material layer may be the same as those included in the resin layer. Among them, from the viewpoint of further reducing the heterogeneity of the dielectric constant, it is preferable that one or more selected from the component (D) and the component (F) are included, it is more preferable that both the component (D) and the component (F) are included, and it is still preferable that a polyaminobismaleimide compound as the component (D) and a polyphenylene ether derivative as the component (F) are included.

A content of the component (D) in the resin composition included in the fiber base material layer is not particularly limited. However, from the viewpoint of further reducing the heterogeneity of the dielectric constant, the content of the component (D) is preferably 1% by mass to 50% by mass, and more preferably 2% by mass to 30% by mass, and still more preferably 3% by mass to 10% by mass with respect to the total mass of the solid content of the resin composition.

A content of the component (F) in the resin composition included in the fiber base material layer is not particularly limited. However, from the viewpoint of further reducing the heterogeneity of the dielectric constant, the content of the component (F) is preferably 5% by mass to 80% by mass, and more preferably 10% by mass to 60% by mass, and still more preferably 20% by mass to 40% by mass with respect to the total mass of the solid content of the resin composition.

From the viewpoint of low transmission loss, a difference in dielectric constant between the fiber base material and the resin composition included in fiber base material layer is preferably 1.0 or less, more preferably 0.5 or less, and still more preferably 0.1 or less.

In order to control the difference in dielectric constant between the fiber base material and the resin composition to 1.0 or less, the dielectric constant of the resin composition has only to be made close to the dielectric constant of the fiber base material to be used. For example, when the aforementioned thermoplastic resin or thermosetting resin is used as the resin, the dielectric constant may be controlled to about 2 to 4 through selection of a kind of the resin, a blending ratio, or the like. In the case where the dielectric constant of the fiber base material is large so that the difference in dielectric constant is larger, when an inorganic filler, a flame retardant, or the like having a higher dielectric constant than the resin is added to this resin, the dielectric constant of the corresponding resin may be further increased. For example, in view of the fact that the dielectric constant of E-glass is about 6.8, whereas the dielectric constant of a general epoxy resin is about 3.8, when a resin composition in which 100 parts by mass of the epoxy resin and 300 parts by mass of an alumina filler having a dielectric constant of about 10 are mixed is used relative to the fiber base material of the E-glass, the difference in dielectric constant between the fiber base material and the resin composition may be controlled to 1.0 or less.

As for the fiber base material layer, those obtained by heating and/or pressurizing a known prepreg alone or a laminate of plural prepregs may be used. Examples of the known prepreg include commercially available "GWA-900G", "GWA-910G", "GHA-679G", "GHA-679G (S)", "GZA-71G", all of which are trade names and manufactured by Hitachi Chemical Company, Ltd., and the like.

(Production Method of Multilayered Transmission Line Plate)

The multilayered transmission line plate of the present invention is obtained by using a prepreg for forming the fiber base material layer and a resin film for forming the resin layer and appropriately combining and laminating them in conformity with an embodiment. For example, the multilayered transmission line plate may be produced by subjecting a copper foil of one side of a laminated plate obtained by curing the prepreg having a copper foil laminated on the both surfaces thereof to circuit processing, thereby forming an insulating layer in which a differential wiring is disposed on one of the surfaces, and a ground layer is disposed on the other surface, and subsequently, laminating the corresponding resin film and the copper foil constituting the ground layer in this order on the surface on which the differential wiring has been formed, followed by molding.

[Prepreg]

The prepreg for forming the fiber base material layer includes the fiber base material and the resin or the resin composition, each of which is used for the fiber base material layer. The prepreg can be, for example, obtained by a method of impregnating the fiber base material with a resin varnish which is obtained by dissolving and/or dispersing the resin or the resin composition in an organic solvent.

Although the method of impregnating the fiber base material with the resin varnish is not particularly limited, examples thereof include a method of immersing the fiber base material in the resin varnish, a method of coating the resin varnish on the fiber base material by a coater of every kind, a method of blowing the resin varnish onto the fiber base material by a spray, and the like. Among them, from the viewpoint of improving the impregnation properties of the resin varnish, the method of immersing the fiber base material in the resin varnish may be adopted.

As for a drying condition after impregnating the fiber base material with the resin varnish, for example, conditions under which a content of the organic solvent in the prepreg after drying is 10% by mass or less or 5% by mass or less may be adopted. For example, the prepreg may be formed by drying the resin varnish containing 30% by mass to 60% by mass of the organic solvent at 50° C. to 150° C. for about 3 minutes to 10 minutes.

From the viewpoint of low transmission loss, a difference in dielectric constant between the fiber base material and the resin composition on the occasion of curing the prepreg is preferably 1.0 or less, more preferably 0.5 or less, and still more preferably 0.1 or less.

Although the dielectric constant on the occasion of curing the prepreg is not particularly limited, from the viewpoint of further conforming with the use in a high-frequency region, it is preferably 4.0 or less, and more preferably 3.8 or less.

The thickness of the prepreg has only to be appropriately determined in conformity with a thickness of the insulating layer to be formed.

[Resin Film]

The resin film for forming the resin layer includes the resin or the resin composition which is used for the aforementioned resin layer.

The resin film may be obtained by a known method, and for example, it may be obtained by a method in which the aforementioned resin, optionally after mixing with the aforementioned other components, is subjected to layer formation on a support. The mixing method is not particularly limited, and a known method may be adopted. Example of the method of subjecting the resin or the resin composition to layer formation on the support include a method in which a resin varnish is prepared by dissolving and/or dispersing the resin or the resin composition in an organic solvent, and the resin varnish is coated on the support using a coater of every kind, followed by drying by means of heating, blowing of hot air, or the like.

The resin film thus obtained may be in a semi-cured state (B-stage). The semi-cured resin film may be in a state where an adhesive force is secured when laminated and cured and also in a state where embedding properties (flowability) into a differential wiring are secured.

Although the organic solvent which is used for the resin varnish is not particularly limited, examples thereof include alcohols, such as methanol, ethanol, and butanol; ethers, such as ethyl cellosolve, butyl cellosolve, ethylene glycol monomethyl ether, carbitol, and butyl carbitol; ketones, such as acetone, methyl ethyl ketone, methyl isobutyl ketone, and cyclohexanone; aromatic hydrocarbons, such as toluene, xylene, and mesitylene; esters, such as methoxyethyl acetate, ethoxyethyl acetate, butoxyethyl acetate, and ethyl acetate; and nitrogen-containing compounds, such as N,N-dimethylformamide, N,N-dimethylacetamide, and N-methyl-2-pyrrolidone. These organic solvents may be used alone or in combination of two or more thereof.

Although a solid content (non-volatile content) concentration of the resin varnish is not particularly limited, for example, it may be set to 5% by mass to 80% by mass.

The coater which is used on the occasion of coating the resin varnish on the support may be appropriately selected in conformity with the thickness of the resin film to be formed, or the like. For example, a die coater, a comma coater, a bar coater, a kiss coater, a roll coater, and the like may be used.

As for drying conditions after coating the resin varnish on the support, for example, conditions under which the content of the organic solvent in the resin film after drying is 10% by mass or less or 5% by mass or less may be adopted. For example, the resin film may be formed by drying the varnish containing 30% by mass to 60% by mass of the organic solvent at 50° C. to 150° C. for about 3 minutes to 10 minutes. As for the drying conditions, suitable drying conditions may be appropriately set through a simple experiment in advance.

A thickness of the resin film may be appropriately determined in conformity with the thickness of the insulating layer to be formed.

Examples of the support of the resin film include films made of a polyolefin, such as polyethylene, polypropylene, or polyvinyl chloride; a polyester, such as polyethylene terephthalate, or polyethylene naphthalate; a polycarbonate, a polyimide, or the like; and also include a release paper, a metal foil (a copper foil, an aluminum foil, etc.), and the like. The support and a protective film as mentioned later may be subjected to a matting treatment, a corona treatment, a release treatment or the like.

The thickness of the support may be, for example, set to 10 μm to 150 μm and may also be set to 25 μm to 50 μm. A protective film may be further laminated on the surface of the resin film on which the support is not provided. The protective film may be made of a material which is the same as or different from the support. A thickness of the protective film is, for example, 1 μm to 40 μm. By laminating the protective film, contamination by foreign substances may be prevented from occurring, and the resin film may be stored upon being wound up in a roll state.

[Laminate Molding Conditions]

Although a molding method and molding conditions of the multilayered transmission line plate according to the present invention are not particularly limited, for example, a molding method and molding conditions of laminated plate and multilayered plate for electric insulating material may be applied. Specifically, the multilayered transmission line plate may be molded by using, for example, a multi-stage press, a multi-stage vacuum press, a continuous molding machine, an autoclave molding machine, or the like at a temperature of 100° C. to 250° C. and a pressure of 0.2 MPa to 10 MPa for a heating time in the range of 0.1 hours to 5 hours.

The ground layer may be formed through lamination of a metal foil as mentioned above, or may be formed using a known method, such as dry plating, etc.

A via hole or a through-hole may be formed by boring the insulating layer of the resulting multilayered transmission line plate. The boring may be performed by a known method using a drill, a laser, a plasma, or the like, and if desired, may be performed through a combination of these methods.

As for the embodiment of the multilayered transmission line plate of the present invention, multilayered transmission line plates according to first to third embodiments are hereinafter cited as examples, and each of the embodiments is described by reference to the accompanying drawings.

The respective materials constituting layers included in the multilayered transmission line plates according to first to third embodiments, the embodiments of respective layers, lamination conditions, and the like are those as described above with respect to the multilayered transmission line plate of the present invention, and preferred embodiments are also the same.

<Multilayered Transmission Line Plate According to First Embodiment>

FIG. 3 is a schematic cross-sectional view showing a multilayered transmission line plate 1A according to a first embodiment of the present invention.

As shown in FIG. 3, the multilayered transmission line plate 1A according to the first embodiment of the present invention includes one pair of ground layers 11 and 21, a differential wiring layer 101 containing differential wiring 91 disposed between one ground layer 11 and the other ground layer 21 of the one pair of the ground layers 11 and 21, an insulating portion (1-I) 31 disposed between the differential wiring layer 101 and the one ground layer 11, and an insulating portion (1-II) 32 disposed between the differential wiring layer 101 and the other ground layer 21. The insulating layer (1-I) 31 is a resin layer, the insulating layer (1-II) 32 is a fiber base material layer, and a thickness of the insulating layer (1-I) 31 is equal to or thinner than a thickness of the second insulating layer (1-II) 32.

FIG. 6 is a schematic cross-sectional view showing a conventional multilayered transmission line plate 4A. The conventional multilayered transmission line plate 4A was produced by a method in which a copper foil of one side of a laminated plate obtained by laminating a copper foil on both surfaces of a prepreg and then curing it is subjected to circuit processing, thereby forming an insulating layer 62 in which a differential wiring 94 is disposed on one surface thereof, and a ground layer 24 is disposed on the other surface, and a prepreg for forming an insulating layer 61 and a copper foil constituting a ground layer 14 are further laminated in this order on the surface of the side of the differential wiring 94, followed by molding.

In the multilayered transmission line plate 1A according to the first embodiment of the present invention, by changing the insulating layer 61 in the conventional multilayered transmission line plate 4A shown in FIG. 6 to the insulating layer (1-I) 31 that is a resin layer, it is able to contemplate to reduce the skew without impairing the handling properties.

At this time, it is important that the thickness of the insulating layer (1-I) 31 is equal to or thinner than the thickness of the insulating layer (1-II) 32.

This is because at the time of signal transmission, a stronger electric field is generated on the side of a thin insulating layer, and therefore, electric properties of the insulating layer are more strongly reflected in transmission properties of signal. That is, in order to reflect the homogeneity of the dielectric constant of the insulating layer (1-I) 31 that is a resin layer, it is important that the thickness of the insulating layer (1-I) 31 is equal to the thickness of the insulating layer (1-II) 32 that is a fiber base material layer, or thinner than the thickness of the insulating layer (1-II) 32. From the viewpoint of further reducing the skew, it is preferable that the thickness of the insulating layer (1-I) 31 is thinner than the thickness of the insulating layer (1-II) 32. From the same viewpoint, it is preferable that the insulating layer (1-I) and the insulating layer (1-II) 32 are asymmetric with respect to the differential wiring layer.

Although the thickness of the insulating layer (1-I) 31 is not particularly limited, it may be, for example, 10 μm to 300 μm. From the viewpoint of satisfying both thinning and loss reduction, the thickness of the insulating layer (1-I) 31 may be set to 20 μm to 250 μm, and from the same viewpoint, it may also be set to 30 μm to 200 μm.

The thickness of the insulating layer (1-I) 31 is equal to or thinner than the thickness of the insulating layer (1-II) 32, and from the viewpoint of inhibiting a warp of a substrate, it may be set to less than the thickness of the insulating layer (1-II) 32.

In addition, from the same viewpoint, a difference between the thickness of the insulating layer (1-I) 31 and the thickness of the insulating layer (1-II) 32 may be set to 0 μm to 150 μm and may also be set to 0.01 μm to 100 μm.

Although the thickness of the insulating layer (1-II) 32 is not particularly limited, it may be, for example, 30 μm to 400 μm. From the viewpoint of satisfying both thinning and loss reduction, the thickness of the insulating layer (1-II) 32 may be set to 40 μm to 300 μm, and from the same viewpoint, it may also be set to 50 μm to 200 μm.

(Production Method of Multilayered Transmission Line Plate According to First Embodiment)

Next, the production method of the multilayered transmission line plate 1A according to the first embodiment of the present invention is described.

The multilayered transmission line plate 1A according to the first embodiment of the present invention may be, for example, produced by a method in which a copper foil of one side of a laminated plate obtained by laminating a copper foil on both surfaces of a prepreg and then curing it is subjected to circuit processing, thereby forming the insulating layer (1-II) 32 in which the differential wiring 91 is disposed on one surface thereof, and the ground layer 21 is disposed on the other surface, and subsequently, a resin film for forming the insulating layer (1-I) 31 and a copper foil constituting the ground layer 11 are laminated in this order on the surface on which the differential wiring 91 is formed, followed by molding.

In the aforementioned multilayered transmission line plate according to the first embodiment of the present invention, a configuration in which the insulating layer (1-I) 31 and the insulating layer (1-II) 32 shown in FIG. 3 are made upside down may be formed in the same manner as mentioned above and adopted.

Next, the multilayered transmission line plate according to a second embodiment of the present invention is described.

<Multilayered Transmission Line Plate According to Second Embodiment>

FIG. 4 is a schematic cross-sectional view showing a multilayered transmission line plate 2A according to the second embodiment of the present invention.

As shown in FIG. 4, the multilayered transmission line plate 2A according to the second embodiment of the present invention is a multilayered transmission line plate which includes one pair of ground layers 12 and 22, a differential wiring layer 102 containing a differential wiring 92 disposed between one ground layer 12 and the other ground layer 22 of the one pair of the ground layers 12 and 22, an insulating layer (2-I) 41 disposed between the differential wiring layer 102 and one ground layer 12, and an insulating layer (2-II)

42 disposed between the differential wiring layer 102 and the other ground layer 22, wherein the insulating layer (2-II) 42 has two or more layers of an insulating layer (2-IIA) 42a and an insulating layer (2-IIB) 42b laminated on the insulating layer (2-IIA) 42a, the insulating layer (2-I) 41 is a fiber base material layer, the insulating layer (2-IIA) 42a is a resin layer, the insulating layer (2-IIB) 42b is a fiber base material layer, and the thickness of the insulating layer (2-II) 42 is equal to or thinner than the thickness of the insulating layer (2-I) 41.

Although FIG. 4 shows an example in which the insulating layer (2-IIB) 42b is disposed between the differential wiring layer 102 and the insulating layer (2-IIA) 42a, an embodiment in which the insulating layer (2-IIA) 42a is disposed between the differential wiring layer 102 and the insulating layer (2-IIB) 42b may also be adopted.

In the multilayered transmission line plate 2A according to the second embodiment of the present invention, by changing the insulating layer 62 in the conventional multilayered transmission line plate 4A shown in FIG. 6 to the insulating layer (2-II) 42 having the insulating layer (2-IIA) 42a which is a resin layer and the insulating layer (2-IIB) 42b which is a fiber base material layer, it is able to contemplate to reduce the heterogeneity of the dielectric constant and to reduce the skew without impairing the handling properties. At this time, for the same reason as mentioned above, it is important that the thickness of the insulating layer (2-II) 42 including the insulating layer (2-IIA) 42a is equal to the thickness of the insulating layer (2-I) 41 which is a fiber base material layer, or thinner than the thickness of the insulating layer (2-I) 41. From the viewpoint of further reducing the skew, it is preferable that the thickness of the insulating layer (2-II) 42 is thinner than the thickness of the insulating layer (2-I) 41. From the same viewpoint, it is preferable that the insulating layer (2-II) 42 and the insulating layer (2-I) 41 are asymmetric with respect to the differential wiring layer.

Although the thickness of the insulating layer (2-I) 41 is not particularly limited, it may be, for example, 40 μm to 400 μm, and from the viewpoint of satisfying both thinning and loss reduction, the thickness of the insulating layer (2-I) 41 may be set to 50 μm to 300 μm, and from the same viewpoint, it may also be set to 60 μm to 200 μm.

Although the thickness of the insulating layer (2-II) 42 is not particularly limited, it may be, for example, 40 μm to 400 μm, and from the viewpoint of satisfying both thinning and loss reduction, the thickness of the insulating layer (2-II) 42 may be set to 60 μm to 300 μm, and from the same viewpoint, it may also be set to 80 μm to 200 μm.

Although the thickness of the insulating layer (2-IIA) 42a is not particularly limited, it may be, for example, 10 μm to 300 μm, and from the viewpoint of satisfying both thinning and loss reduction, the thickness of the insulating layer (2-IIA) 42a may be set to 20 μm to 260 μm, and from the same viewpoint, it may also be set to 30 μm to 150 μm.

Although the thickness of the insulating layer (2-IIB) 42b is not particularly limited, it may be, for example, 30 μm to 390 μm, and from the viewpoint of satisfying both thinning and loss reduction, the thickness of the insulating layer (2-IIB) 42b may be set to 40 μm to 280 μm, and from the same viewpoint, it may also be set to 50 μm to 170 μm.

Although a ratio of the thickness of the insulating layer (2-IIA) 42a to the thickness of the insulating layer (2-IIB) 42b [{insulating layer (2-IIA)}/{insulating layer (2-IIB)}] is not particularly limited, it may be, for example, 0.1 to 3.0, and from the viewpoint of satisfying both thinning and loss reduction, the ratio may be set to 0.3 to 2.0, and from the same viewpoint, it may also be set to 0.5 to 1.8.

The thickness of the insulating layer (2-II) 42 is equal to or thinner than the thickness of the insulating layer (2-I) 41, and from the viewpoint of satisfying both thinning and loss reduction, the thickness of the insulating layer (2-II) 42 may be set to be thinner than the thickness of the insulating layer (2-I) 41.

In addition, from the same viewpoint, a difference between the thickness of the insulating layer (2-I) 41 and the thickness of the insulating layer (2-II) 42 may be set to 0 μm to 150 μm and may also be set to 0.01 μm to 100 μm.

(Production Method of Multilayered Transmission Line Plate According to Second Embodiment)

Next, the production method of the multilayered transmission line plate 2A according to the second embodiment of the present invention is described.

The multilayered transmission line plate 2A according to the second embodiment of the present invention may be, for example, produced by a method in which a copper foil on one surface of a laminated plate obtained by laminating a copper foil on both surfaces of a prepreg and then curing it is subjected to circuit processing, and the copper foil on the other surface is removed, thereby forming the insulating layer (2-IIB) 42b in which the differential wiring 92 is disposed on one surface thereof, and subsequently, a prepreg for forming the insulating layer (2-I) 41 and a copper foil constituting the ground layer 12 are laminated in this order on the surface on which the differential wiring 92 is formed, and a resin film for forming the insulating layer (2-IIA) 42a and a copper foil constituting the ground layer 22 are laminated in this order on the surface of the insulating layer (2-IIB) 42b on the opposite side to the differential wiring 92, followed by molding.

<Multilayered Transmission Line Plate According to Third Embodiment>

FIG. 5 is a schematic cross-sectional view showing a multilayered transmission line plate 3A according to the third embodiment of the present invention.

As shown in FIG. 5, the multilayered transmission line plate 3A according to the third embodiment of the present invention is a multilayered transmission line plate which includes one pair of ground layers 13 and 23, a differential wiring layer 103 including a differential wiring 93 disposed between one ground layer 13 and the other ground layer 23 of the one pair of the ground layers 13 and 23, an insulating layer (3-I) 51 disposed between the differential wiring layer 103 and the one ground layer 13, and an insulating layer (3-II) 52 disposed between the differential wiring layer 103 and the other ground layer 23, wherein the insulating layer (3-II) 52 has two or more layers of an insulating layer (3-IIA) 52a and an insulating layer (3-IIB) 52b laminated on the insulating layer (3-IIA) 52a, the insulating layer (3-I) 51 is a resin layer, the insulating layer (3-IIA) 52a is a resin layer, and the insulating layer (3-IIB) 52b is a fiber base material layer.

Although FIG. 5 shows an example in which the insulating layer (3-IIB) 52b is disposed between the differential wiring layer 103 and the insulating layer (3-IIA) 52a, the insulating layer (3-IIA) 52a may also be disposed between the differential wiring layer 103 and the insulating layer (3-IIB) 52b.

In the multilayered transmission line plate 3A according to the third embodiment of the present invention, by changing the insulating layer 62 in the conventional multilayered transmission line plate 4A shown in FIG. 6 to the insulating layer (3-II) 52 having the insulating layer (3-IIA) 52a that is a resin layer and the insulating layer (3-IIB) 52*b* that is a fiber base material layer as well as changing the insulating layer 61 to the insulating layer (3-I) 51 that is a resin layer, it is able to contemplate to reduce the skew without impairing the handling properties.

In the multilayered transmission line plate 3A according to the third embodiment of the present invention, since the resin layer interposes between the differential wiring layer 103 and one ground layer 13 as well as between the differential wiring layer 103 and the other ground layer 23, an effect of reducing the skew may be obtained regardless of the thicknesses of the insulating layer (3-I) 51 and the insulating layer (3-II) 52.

Although a thickness of the insulating layer (3-I) 51 is not particularly limited, it may be, for example, 10 μm to 300 μm, and from the viewpoint of satisfying both thinning and loss reduction, the thickness of the insulating layer (3-I) 51 may be set to 20 μm to 250 μm, and from the same viewpoint, it may also be set to 30 μm to 200 μm.

Although a thickness of the insulating layer (3-II) 52 is not particularly limited, it may be, for example, 40 μm to 300 μm, and from the viewpoint of satisfying both thinning and loss reduction, the thickness of the insulating layer (3-II) 52 may be set to 60 μm to 250 μm, and from the same viewpoint, it may also be set to 80 μm to 200 μm.

Although a thickness of the insulating layer (3-IIA) 52*a* is not particularly limited, it may be, for example, 10 μm to 270 μm, and from the viewpoint of satisfying both thinning and loss reduction, the thickness of the insulating layer (3-IIA) 52*a* may be set to 20 μm to 210 μm, and from the same viewpoint, it may also be set to 30 μm to 150 μm.

Although a thickness of the insulating layer (3-IIB) 52*b* is not particularly limited, it may be, for example, 30 μm to 290 μm, and from the viewpoint of satisfying both thinning and loss reduction, the thickness of the insulating layer (3-IIB) 52*b* may be set to 40 μm to 230 μm, and from the same viewpoint, it may also be set to 50 μm to 170 μm.

Although a ratio of the thickness of the insulating layer (3-IIA) 52*a* to the thickness of the insulating layer (3-IIB) 52*b* [{insulating layer (3-IIA)}/{insulating layer (3-IIB)}] is not particularly limited, from the viewpoint of satisfying both thinning and loss reduction, the ratio may be set to 0.2 to 3.0, and from the same viewpoint, it may be set to 0.3 to 2.0, and it may also be set to 0.5 to 1.5.

(Production Method of Multilayered Transmission Line Plate According to Third Embodiment)

Next, the production method of the multilayered transmission line plate 3A according to the third embodiment of the present invention is described.

The multilayered transmission line plate 3A according to the third embodiment of the present invention may be, for example, produced by a method in which a copper foil on one surface of a laminated plate obtained by laminating a copper foil on both surfaces of a prepreg and then curing it is subjected to circuit processing, and the copper foil on the other surface is removed, thereby forming the insulating layer (3-IIB) 52*b* in which the differential wiring 93 is disposed on one surface thereof, and subsequently, a resin film for forming the insulating layer (3-I) 51 and a copper constituting the ground layer 13 are laminated in this order on the surface on which the differential wiring 93 is formed, and a resin film for forming the insulating layer (3-IIA) 52*a* and a copper foil constituting the ground layer 23 are laminated in this order on the surface of the insulating layer (3-IIB) 52*b* on the opposite side to the differential wiring 93, followed by molding.

Even in all of the multilayered transmission line plates of the first, second, and third embodiments of the present invention, when a low-loss material is used, the transmission loss can be reduced, and the signal quality can be much more improved.

While the preferred embodiments of the present invention have been described, it should be construed that the present invention is not limited to the aforementioned embodiments. The present invention may be modified within a range where a gist thereof is not deviated.

Further, the multilayered transmission line plate of the present invention is suitably used for electronic appliances dealing with high-frequency signals of 1 GHz or more, and in particular, is suitably used for electronic appliances dealing with high-frequency signals of 10 GHz or more, or high-frequency signals of 30 GHz or more.

EXAMPLES

The present invention is hereunder described in more detail based on the following Examples, but it should be construed that the present invention is by no means limited by the following Examples.

Synthesis Example 1

(Preparation of Polyphenylene Ether Derivative)

A polyphenylene ether derivative having at least one N-substituted maleimide group in a molecule was produced according to the following procedures.

In a glass-made flask having a capacity of 2 liters, which was equipped with a thermometer, a reflux condenser, and a stirring device and capable of being heated and cooled, 190 parts by mass of toluene, 100 parts by mass of PP0640 (polyphenylene ether, number average molecular mass: about 16,000, manufactured by SABIC Innovative Plastics), and 1.35 parts by mass of p-aminophenol were charged and dissolved with stirring while setting a temperature within the flask at 90° C. and keeping the temperature. After confirming the dissolution through visual inspection, 2 parts by mass of PERBUTYL-I (t-butyl peroxy isopropyl monocarbonate, manufactured by NOF Corporation) and 0.15 parts by mass of manganese naphthenate were added thereto, and reaction was performed at a solution temperature of 90° C. for 4 hours, followed by being cooled to 70° C., thereby obtaining a reaction solution containing a polyphenylene ether compound having a primary amino group at a molecular end thereof.

Subsequently, to the aforementioned reaction solution, 7.2 parts by mass of 2,2-bis[4-(4-maleimidophenoxy)phenyl]propane (a trade name: BMI-4000, manufactured by Daiwakasei Industry Co., Ltd.) and 190 parts by mass of propylene glycol monomethyl ether were added, the liquid temperature was raised while stirring, reaction was performed for 4 hours while keeping the temperature at 120° C., and the resultant was cooled and subjected to 200-mesh filtration, thereby preparing a polyphenylene ether derivative.

Synthesis Example 2

(Preparation of Polyaminobismaleimide Compound)

In a glass-made flask having a capacity of 1 liter, which was equipped with a thermometer, a reflux condenser, and a stirring device and capable of being heated and cooled, 50 parts by mass of 2,2-bis[4-(4-maleimidophenoxy)phenyl]propane, 50 parts by mass of 3,3'-dimethyl-5,5'-diethyl-4, 4'-diphenylmethane bismaleimide (a trade name: BMI-5100, manufactured by Daiwakasei Industry Co., Ltd.), 14 parts by mass of 4,4'-[1,3-phenylenebis(1-methylethylidene)]bisaniline (a trade name: BISANILINE M, manufactured by Mitsui Chemicals, Inc.), and 50 parts by mass of propylene glycol monomethyl ether were charged, reaction was performed with stirring for 3 hours while keeping the liquid temperature at 120° C., and the resultant was cooled and subjected to 200-mesh filtration, thereby preparing a polyaminobismaleimide compound.

Preparation Example 1

(Preparation of Thermosetting Resin Composition (Resin Varnish) 1)

100 parts by mass of the polyphenylene ether derivative, 450 parts by mass of the polyaminobismaleimide compound as obtained above, 870 parts by mass of an inorganic filler AlOOH (a boehmite-type aluminum hydroxide, density: 3.0 g/cm$^3$, manufactured by Kawai Lime Industry Co., Ltd.), 7 parts by mass of a curing accelerator PERBUTYL-P ($\alpha,\alpha'$-bis(t-butylperoxy)diisopropylbenzene, manufactured by NOF Corporation), 7 parts by mass of G-8009L (isocyanate-masked imidazole, manufactured by Dai-ichi Kogyo Seiyaku Co., Ltd.), and 800 parts by mass of methyl ethyl ketone were used and stirred and mixed while heating at 60° C., thereby preparing a thermosetting resin composition (resin varnish) 1 having a solid content (non-volatile content) concentration of about 55% by mass.

Preparation Example 2

(Preparation of Thermosetting Resin Composition (Resin Varnish) 2)

A thermosetting resin composition (resin varnish) 2 having a solid content (non-volatile content) concentration of about 55% by mass was prepared in the same manner as in Preparation Example 1, except for using 640 parts by mass of AlOOH and 620 parts by mass of methyl ethyl ketone.

Preparation Example 31

(Preparation of Thermosetting Resin Composition (Resin Varnish) 3)

A thermosetting resin composition (resin varnish) 3 having a solid content (non-volatile content) concentration of about 55% by mass was prepared in the same manner as in Preparation Example 1, except for using 460 parts by mass of AlOOH and 470 parts by mass of methyl ethyl ketone.

Preparation Example 4

(Fabrication of Copper-Cladded Laminated Plate 1)

The aforementioned thermosetting resin composition (resin varnish) 1 was coated on a glass cloth having a thickness of 0.1 mm (NE-glass, manufactured by Nitto Boseki Co., Ltd., dielectric constant: 4.4) and then heated for drying at 160° C. for 7 minutes, thereby fabricating a prepreg having a resin content (resin content) of about 54% by mass. A low-profile copper foil having a thickness of 18 µm (FV-WS, surface roughness Rz of roughened surface: 1.5 µm, manufactured by Furukawa Electric Co., Ltd.) was disposed on the top and bottom of the prepreg such that the roughened surface came into contact therewith, and heating and pressurization were performed under conditions of a temperature of 230° C., a pressure of 3.9 MPa, and 180 minutes, thereby fabricating a copper-cladded laminated plate 1 (thickness: 130 µm). Further, a dielectric constant of a resin plate fabricated by heating and curing this thermosetting resin composition (resin varnish) 1 under conditions of a temperature of 230° C. and 180 minutes was measured by the cavity perturbation method (cavity resonator: CP531, manufactured by Kanto Electronic Application and Development Inc.) in a 10 GHz band, and as a result, it was found to be 4.4 (10 GHz). That is, a difference in dielectric constant between the glass cloth and the resin composition, each being included in the copper-cladded laminated plate 1, was 0.

Preparation Example 5

(Fabrication of Copper-Cladded Laminated Plate 2)

A copper-cladded laminated plate 2 (thickness: 130 µm) was fabricated in the same manner as in Preparation Example 4, except for using the aforementioned thermosetting resin composition (resin varnish) 2 instead of the thermosetting resin composition (resin varnish). A dielectric constant of a resin plate fabricated from this resin varnish under the same conditions as in Preparation Example 4 was measured under the same conditions as in Preparation Example 4, and as a result, it was found to be 4.0 (10 GHz). That is, a difference in dielectric constant between the glass cloth and the resin composition, each being included in the copper-cladded laminated plate 2, was 0.4.

Preparation Example 6

(Fabrication of Copper-Cladded Laminated Plate 3)

A copper-cladded laminated plate 3 (thickness: 130 µm) was fabricated in the same manner as in Preparation Example 4, except for using the aforementioned thermosetting resin composition (resin varnish) 3 instead of the thermosetting resin composition (resin varnish). A dielectric constant of a resin plate fabricated from this resin varnish under the same conditions as in Preparation Example 4 was measured under the same conditions as in Preparation Example 4, and as a result, it was found to be 3.6 (10 GHz). That is, a difference in dielectric constant between the glass cloth and the resin composition, each being included in the copper-cladded laminated plate 3, was 0.8.

Example 1

(Fabrication of Multilayered Transmission Line Plate 1A)

The multilayered transmission line plate 1A shown in FIG. 3 was fabricated according to the following procedures.

First of all, a laminated plate in which a copper foil was formed on the both surfaces of the insulating layer (1-II) 32 (a trade name: LW-900G, manufactured by Hitachi Chemical Company, Ltd.) was prepared. A thickness of the insulating layer (1-II) 32 of this laminated plate was 130 µm, a thickness of the copper foil was 18 µm, and the copper foil surface roughness (Rz) on the side of the insulating layer (1-II) 32 was 3.0 µm.

Subsequently, the copper foil on one surface of the aforementioned laminated plate was subjected to patterning by means of etching, thereby forming an inner layer circuit board P. That is, the inner layer circuit board P indicates one in which the differential wiring 91 is disposed on one surface of the insulating layer (1-II) 32, and the ground layer 21 is disposed on the other surface thereof.

Subsequently, the resin film for forming the insulating layer (1-I) 31 was fabricated according to the following procedures.

First, in a four necked flask having a capacity of 300 mL, which was equipped with a thermometer, a reflux condenser, and a stirring device, 16.8 g of BMI-3000 (a trade name, Mw: about 3000, manufactured by Designer Molecules Inc.), 4.9 g of BMI 1000 (a trade name, bis(4-maleimidephenyl)methane, Daiwakasei Industry Co., Ltd), 4.0 g of NC-3000H (a trade name, biphenyl aralkyl type epoxy resin, manufactured by Nippon Kayaku Co.), 1.6 g of KA1165 (a trade name, novolac type phenolic resin, manufactured by DIC Corp.), 104.4 g of silica slurry (spherical fused silica, surface treatment: phenylaminosilane coupling agent (1% by mass/total solid content in slurry), dispersion medium: methyl isobutyl ketone (MIBK), solid content concentration: 70% by mass, average particle size: 0.5 μm, density: 2.2 g/cm$^3$, manufactured by Admatechs Company Ltd, trade name: SC-2050 KNK), 0.42 g of perhexine 25B (a trade name, 2,5-dimethyl-2,5-di (t-butylperoxy) hexane), manufactured by NOF Corporation), 0.11 g of 2E4MZ (a trade name, 2-ethyl-4 methyl-imidazole, manufactured by Shikoku Chemicals Corp.), 8.9 g of toluene, and 2.4 g of methyl ethyl ketone were charged and stirred at 25° C. for 1 hour, and then filtered through a #200 nylon mesh (opening: 75 μm) to obtain a resin composition. The resin composition was applied on a PET film (G2-38, manufactured by Teijin Ltd.) having a thickness of 38 μm as a support base material by using a comma coater, and then dried at 130° C. to obtain a resin film having a thickness of 65 μm. Further, a dielectric constant of a resin plate fabricated by heating and curing the corresponding resin composition under conditions of a temperature of 230° C. and 180 minutes was measured by the cavity perturbation method (cavity resonator: CP531, manufactured by Kanto Electronic Application and Development Inc.) in a 10 GHz band, and as a result, it was found to be 3.0 (10 GHz).

Subsequently, two sheets of the fabricated resin film were superimposed on the surface of the inner layer circuit board P on the side of the differential wiring 91 and temporarily pressure bonded under conditions of a temperature 120° C. and a pressure of 0.5 MPa for a time of 40 seconds. Furthermore, a copper foil having a thickness 18 μm, which constitutes the ground layer 11 (a trade name: 3EC-VLP-18, manufactured by Mitsui Mining and Smelting Co., Ltd., surface roughness Rz of the roughed surface: 3.0 μm), was superimposed on the surface of the resin film on the opposite side to the differential wiring 91 and laminated under conditions of a temperature of 230° C. and a pressure 3.0 MPa for a time of 80 minutes, thereby obtaining a multi-layered transmission line plate before interlayer connection.

Subsequently, the ground layers 11 and 21 of the aforementioned multilayered transmission line plate were subjected to patterning by means of etching, thereby forming a measuring terminal. A hole was bored in the ground pattern part of the aforementioned measuring terminal, and interlayer connection was performed by means of electroless plating, thereby fabricating the multilayered transmission line plate 1A.

Example 2

(Fabrication of Multilayered Transmission Line Plate 1B)

The multilayered transmission line plate 1B was fabricated in the same procedures as in Example 1, except that in Example 1, the thickness of the resin film was changed to 80 μm, and the number of sheet of the resin film to be superimposed on the surface of the inner layer circuit board P on the side of the differential wiring 91 was changed to one.

Example 3

(Fabrication of Multilayered Transmission Line Plate 1C)

The multilayered transmission line plate 1C was fabricated in the same procedures as in Example 1, except that in Example 1, the thickness of the resin film was changed to 50 μm, and the number of sheet of the resin film to be superimposed on the surface of the inner layer circuit board P on the side of the differential wiring 91 was changed to one.

Subsequently, the multilayered transmission line plate shown in FIG. 3 was fabricated using each of the copper-cladded laminated plates 1 to 3 obtained in the respective Preparation Examples.

Example 4

(Fabrication of Multilayered Transmission Line Plate 1D)

First of all, the copper foil on one surface of the aforementioned copper-cladded laminated plate 1 was subjected to patterning by means of etching, thereby forming an inner layer circuit board Q. That is, the inner layer circuit board Q indicates one in which the differential wiring 91 is disposed on one surface of the insulating layer (1-II) 32, and the ground layer 21 is disposed on the other surface.

Subsequently, a multilayered transmission line plate 1D was fabricated by using the resin film fabricated in Example 1 and the aforementioned inner layer circuit board Q and going through the same steps as in Example 1.

Example 51

(Fabrication of Multilayered Transmission Line Plate 1E)

A multilayered transmission line plate 1E was fabricated in the same manner as in Example 4, except that in Example 4, the copper-cladded laminated plate 1 was replaced by the copper-cladded laminated plate 2.

Example 61

(Fabrication of Multilayered Transmission Line Plate 1F)

A multilayered transmission line plate 1F was fabricated in the same manner as in Example 4, except that in Example 4, the copper-cladded laminated plate 1 was replaced by the copper-cladded laminated plate 3.

Example 71

(Fabrication of Multilayered Transmission Line Plate 2A)

The multilayered transmission line plate 2A shown in FIG. 4 was fabricated according to the following procedures.

First of all, a laminated plate in which a copper foil was formed on the both surfaces of the insulating layer (2-IIB) 42*b* (a trade name: LW-900G, manufactured by Hitachi Chemical Company, Ltd.) was prepared. The thickness of the insulating layer (2-IIB) 42*b* of this laminated plate was 80 μm, the thickness of the copper foil was 18 μm, and the copper foil surface roughness (Rz) on the side of the insulating layer (2-IIB) 42*b* was 3.0 μm.

Subsequently, the copper foil on one surface of the aforementioned laminated plate was subjected to patterning by means of etching, and the copper foil on the other surface was removed by means of etching, thereby forming an inner layer circuit board R. That is, the inner layer circuit board R indicates one in which the differential wiring 92 is disposed on one surface of the insulating layer (2-IIB) 42*b*.

Subsequently, a semi-cured resin film having a thickness of 50 μm was fabricated according to the same procedures as in Example 1.

Subsequently, one sheet of the aforementioned resin film was superimposed on the surface of the inner layer circuit board R from which the copper foil had been removed and temporarily pressure bonded under conditions of a temperature 120° C. and a pressure of 0.5 MPa for a time of 40 seconds. Subsequently, a prepreg having a thickness of 130 μm (a trade name: GWA-900G, manufactured by Hitachi Chemical Company, Ltd.) was superimposed on the surface of the inner layer circuit board R on the side of the differential wiring 92, and furthermore, a copper foil having a thickness 18 μm, which constitutes each of the ground layers 22 and 12 (a trade name: 3EC-VLP-18, manufactured by Mitsui Mining and Smelting Co., Ltd., surface roughness Rz of the roughed surface: 3.0 μm), was superimposed on the surface of the resin film on the opposite side to the inner layer circuit board R and the surface of the prepreg on the opposite side to the differential wiring 92, respectively and laminated under conditions of a temperature of 230° C. and a pressure 3.0 MPa for a time of 80 minutes, thereby fabricating a multilayered transmission line plate before interlayer connection.

Subsequently, the ground layers 12 and 22 of the aforementioned multilayered transmission line plate were subjected to patterning by means of etching, thereby forming a measuring terminal. A hole was bored in the ground pattern part of the aforementioned measuring terminal, and interlayer connection was performed by means of electroless plating, thereby fabricating the multilayered transmission line plate 2A.

Example 8

(Fabrication of Multilayered Transmission Line Plate 2B)

A multilayered transmission line plate 2B was fabricated in the same manner as in Example 7, except that in Example 7, the thickness of the insulating layer (2-IIB) 42*b* was changed to 50 μm, and the thickness of the resin film was changed to 80 μm.

Example 9

(Fabrication of Multilayered Transmission Line Plate 2C)

A multilayered transmission line plate 2C was fabricated in the same manner as in Example 7, except that in Example 7, the thickness of the insulating layer (2-IIB) 42*b* was changed to 50 μm.

Example 10

(Fabrication of Multilayered Transmission Line Plate 3A)

The multilayered transmission line plate 3A shown in FIG. 5 was fabricated according to the following procedures.

First of all, a laminated plate in which a copper foil was formed on the both surfaces of the insulating layer (3-IIB) 52*b* (a trade name: LW-900G, manufactured by Hitachi Chemical Company, Ltd.) was prepared. The thickness of the insulating layer (3-IIB) 52*b* was 80 μm, the thickness of the copper foil was 18 μm, and the copper foil surface roughness (Rz) on the side of the insulating layer (3-IIB) 52*b* was 3.0 μm.

Subsequently, the copper foil on one surface of the aforementioned laminated plate was subjected to patterning by means of etching, and the copper foil on the other surface was removed by means of etching, thereby forming an inner layer circuit board S. That is, the inner layer circuit board S indicates one in which the differential wiring 93 is disposed on one surface of the insulating layer (3-IIB) 52*b*.

Subsequently, semi-cured resin films having a thickness of 50 μm and 65 μm, respectively were fabricated according to the same procedures as in Example 1.

Subsequently, one sheet of the 50 μm-thick resin film was superimposed on the surface of the inner layer circuit board S from which the copper foil had been removed, two sheets of the 65 μm-thick resin film were superimposed on the surface of the inner layer circuit board S on the side of the differential wiring 93, and these sheets were temporarily pressure bonded, respectively under conditions of a temperature of 120° C. and a pressure of 0.5 MPa for a time of 40 seconds. Furthermore, a copper foil having a thickness 18 μm, which constitutes each of the ground layers 23 and 13 (a trade name: 3EC-VLP-18, manufactured by Mitsui Mining and Smelting Co., Ltd., surface roughness Rz of the roughed surface: 3.0 μm), was superimposed on each of the surface of the 50 μm-thick resin film on the opposite side to the inner layer circuit board S and the surface of the 65 μm-thick resin film on the opposite side to the differential wiring 93, respectively and laminated under conditions of a temperature of 230° C. and a pressure 3.0 MPa for a time of 80 minutes, thereby fabricating a multilayered transmission line plate before interlayer connection.

Subsequently, the ground layers 13 and 23 of the aforementioned multilayered transmission line plate were subjected to patterning by means of etching, thereby forming a measuring terminal. A hole was bored in the ground pattern part of the aforementioned measuring terminal, and interlayer connection was performed by means of electroless plating, thereby fabricating the multilayered transmission line plate 3A.

Example 11

(Fabrication of Multilayered Transmission Line Plate 3B)

A multilayered transmission line plate 3B was fabricated in the same manner as in Example 10, except that in Example 10, the thickness of the resin film temporarily pressure bonded on the surface of the inner layer circuit board S from which the copper foil had been removed was changed to 80 μm.

Example 12

(Fabrication of Multilayered Transmission Line Plate 3C)

A multilayered transmission line plate 3C was fabricated in the same manner as in Example 10, except that in Example 10, the thickness of the insulating layer (3-IIB) 52*b* was changed to 50 μm.

Comparative Example 1

(Fabrication of Multilayered Transmission Line Plate 4A)

The multilayered transmission line plate 4A shown in FIG. 6 was fabricated according to the following procedures.

First of all, a laminated plate in which a copper foil was formed on the both surfaces of the insulating layer 62 (a trade name: LW-900G, manufactured by Hitachi Chemical Company, Ltd.) was prepared. The thickness of the insulating layer 62 was 130 μm, the thickness of the copper foil was 18 μm, and the copper foil surface roughness (Rz) on the side of the insulating layer 62 was 3.0 μm.

Subsequently, the copper foil on one surface of the aforementioned laminated plate was subjected to patterning by means of etching, thereby forming an inner layer circuit board T. That is, the inner layer circuit board T indicates one in which the differential wiring 94 is disposed on one surface of the insulating layer 62, and the ground layer 24 is disposed on the other surface.

Subsequently, a prepreg having a thickness of 130 μm (a trade name: GWA-900G, manufactured by Hitachi Chemical Company, Ltd.) was superimposed on the surface of the inner layer circuit board T on the side of the differential wiring 94, and furthermore, a copper foil having a thickness of 18 μm, which constitutes the ground layer 14 (a trade name: 3EC-VLP-18, manufactured by Mitsui Mining and Smelting Co., Ltd., surface roughness Rz of the roughed surface: 3.0 μm), was superimposed on the surface of the prepreg on the opposite side to the differential wiring 94 and laminated under conditions of a temperature of 230° C. and a pressure 3.0 MPa for a time of 80 minutes, thereby fabricating a multilayered transmission line plate before interlayer connection.

Subsequently, the ground layers 14 and 24 of the aforementioned multilayered transmission line plate were subjected to patterning by means of etching, thereby forming a measuring terminal. A hole was bored in the ground pattern part of the aforementioned measuring terminal, and interlayer connection was performed by means of electroless plating, thereby fabricating the multilayered transmission line plate 4A.

Comparative Example 2

(Fabrication of Multilayered Transmission Line Plate 5A)

The multilayered transmission line plate 5A shown in FIG. 7 was fabricated according to the following procedures.

A multilayered transmission line plate 5A was fabricated in the same manner as in Example 1, except that in Example 1, the thickness of the insulating layer (1-II) 32 was changed to 50 μm.

Comparative Example 3

(Fabrication of Multilayered Transmission Line Plate 6A)

A multilayered transmission line plate 6A shown in FIG. 8 was fabricated in the same manner as in Example 7, except that in Example 7, the thickness of the insulating layer (2-IIB) 42b was changed to 130 μm.

[Measuring Method of Skew]

The skew of each of the above-obtained multilayered transmission line plates was measured by the following method.

A high-frequency signal of 10 GHz was entered into the differential wiring from a network analyzer (a trade name: N5227A, manufactured by Keysight Technologies) connected via a coaxial cable (a trade name: SUCOFLEX 104, manufactured by (HUBER-SUHNER), and a delay time when the signal propagated through the wiring was measured. The skew was calculated from a difference in delay time between the wirings.

When defining the skew of the multilayered transmission line plate of Comparative Example 1 having a conventional structure as 100%, respective proportions (%) relative to the skew of Comparative Example 1 are shown in Tables 1 to 3. The smaller the numerical value, the higher the effect for reducing the skew is.

TABLE 1

|  | Example 1 | Example 2 | Example 3 | Example 4 | Example 5 | Example 6 | Comparative Example 1 | Comparative Example 2 |
|---|---|---|---|---|---|---|---|---|
| Multilayered transmission line plate | 1A | 1B | 1C | 1D | 1E | 1F | 4A | 5A |
| Thickness of insulating layer (1-I) (μm) | 130 | 80 | 50 | 130 | 130 | 130 | (130) *1 | 130 |
| Thickness of insulating layer (1-II) (μm) | 130 | 130 | 130 | 130 | 130 | 130 | (130) *1 | 50 |
| Skew (%) | 6 | 6 | 4 | 1 | 5 | 8 | 100 | 39 |

*1: Thickness of each of the insulating layers 61 and 62 in the multilayered transmission line plate 4A

TABLE 2

|  | Example 7 | Example 8 | Example 9 | Comparative Example 1 | Comparative Example 3 |
|---|---|---|---|---|---|
| Multilayered transmission line plate | 2A | 2B | 2C | 4A | 6A |
| Thickness of insulating layer (2-I) (μm) | 130 | 130 | 130 | (130) *1 | 130 |
| Thickness of insulating layer (2-II) (μm) | 130 | 130 | 100 | (130) *1 | 180 |
| Thickness of insulating layer (2-IIB) (μm) | 80 | 50 | 50 | — | 130 |
| Thickness of insulating layer (2-IIA) (μm) | 50 | 80 | 50 | — | 50 |
| Skew (%) | 22 | 13 | 14 | 100 | 95 |

*1: Thickness of each of the insulating layers 61 and 62 in the multilayered transmission line plate 4A

TABLE 3

|  | Example 10 | Example 11 | Example 12 | Comparative Example 1 |
|---|---|---|---|---|
| Multilayered transmission line plate | 3A | 3B | 3C | 4A |
| Thickness of insulating layer (3-I) (μm) | 130 | 130 | 130 | (130) *1 |

TABLE 3-continued

|  | Example 10 | Example 11 | Example 12 | Comparative Example 1 |
|---|---|---|---|---|
| Thickness of insulating layer (3-II) (μm) | 130 | 160 | 100 | (130) *1 |
| Thickness of insulating layer (3-IIB) (μm) | 80 | 80 | 50 | — |
| Thickness of insulating layer (3-IIA) (μm) | 50 | 80 | 50 | — |
| Skew (%) | 7 | 3 | 5 | 100 |

*1: Thickness of each of the insulating layers 61 and 62 in the multilayered transmission line plate 4A Examples 1 to 6 are concerned with an example in which in the multilayered transmission line plate 4A of Comparative Example 1 having a conventional structure, a part of the fiber base material layer is changed to a resin layer. Although Examples 1 to 6 are each different in the thickness of the insulating layer, in all of these Examples 1 to 6, the skew is significantly reduced to 1 to 8%. This appears to be caused since the heterogeneity of the dielectric constant is greatly improved by substituting the material.

Comparative Example 2 is concerned with an example in which in the multilayered transmission line plate 1A of Example 1, the thickness of the insulating layer (1-II) 32 is thinner than the thickness of the insulating layer (1-I) 31. In Comparative Example 2, the skew is 39%, and the effect of reducing the skew is low as compared with that in Example 1. It may be considered that this was caused due to the matter that in the multilayered transmission line plate 5A of Comparative Example 2, an electric field formed between the differential wiring 95 and the ground layers 15 and 25 becomes stronger on the side of the insulating layer 72 at which the distance between the differential wiring 95 and the ground layer is short, and therefore, the influence of the material including the fiber base material (glass cloth) is more strongly received. That is, it may be considered that the influence of the heterogeneity of the dielectric constant is more likely received, and as a result, the effect of reducing the skew is lowered.

Examples 7 to 9 are concerned with an example in which in the multilayered transmission line plate 4A of Comparative Example 1 having a conventional structure, a part of the insulating layer 62 which is a fiber base material layer is changed to the insulating layer (2-IIA) 42a that is a resin layer. In all of Examples 7 to 9, the skew is reduced to 13 to 22%. It may be considered that this was caused due to the matter that by substituting the material, the heterogeneity of the dielectric constant is greatly improved.

Comparative Example 3 is concerned with an example in which in the multilayered transmission line plates of Examples 7 to 9, the thickness of the insulating layer (2-IIB) 42b is made thick.

It may be considered that as in the multilayered transmission line plate 6A of Comparative Example 3, even in the case where the insulating layer 82a that is a resin layer is laminated, when the thickness of the insulating layer 82 including the insulating layer 82a which is the rein layer is thicker than the thickness of the insulating layer 81, similar to Comparative Example 2, the influence of the material including a fiber base material (glass cloth), namely, the influence of the layer in which the dielectric constant is heterogeneous is more likely received, and as a result, the effect of reducing the skew is lowered.

Examples 10 to 12 are concerned with an example in which in the multilayered transmission line plate 4A of Comparative Example 1 having a conventional structure, a part of the insulating layer 62 that is a fiber base material layer is changed to the insulating layer (3-IIA) 52a that is a resin layer and the insulating layer 61 is changed to the insulating layer (3-I) 51 that is a resin layer. In all of Examples 10 to 12, the skew is significantly reduced to less than 10%. It may be considered that this was caused due to the matter that by substituting the material, the heterogeneity of the dielectric constant is greatly improved.

It is noted from the aforementioned measurement results that the multilayered transmission line plate of the present invention is able to reduce a skew in the differential transmission without adopting a complicated process. Furthermore, all of these structures have an insulating layer including a fiber base material, and the aforementioned effects can be obtained without impairing the handling properties.

REFERENCE SIGNS LIST

1A~6A: Multilayered transmission line plate
11~16, 21~26: Ground layer
31: Insulating layer (1-I)
32: Insulating layer (1-II)
41: Insulating layer (2-I)
42: Insulating layer (2-II)
42a: Insulating layer (2-IIA)
42b: Insulating layer (2-IIB)
51: Insulating layer (3-I)
52: Insulating layer (3-II)
52a: Insulating layer (3-IIA)
52b: Insulating layer (3-IIB)
61, 62, 72, 81, 82b: Insulating layer (Fiber base material layer)
71, 82a: Resin layer
91 to 96: Differential wiring
101 to 106: Differential wiring layer

The invention claimed is:

1. A multilayered transmission line plate comprising:
one pair of ground layers,
a differential wiring layer disposed between one ground layer and the other ground layer of the one pair of ground layers,
a first insulating portion disposed between the differential wiring layer and the one ground layer, and
a second insulating portion disposed between the differential wiring layer and the other ground layer,
wherein the first insulating portion has a resin layer, the first insulating portion or the second insulating portion has a fiber base material layer containing a fiber base material, and a thickness of the first insulating portion is equal to or thinner than a thickness of the second insulating portion, and
wherein the resin layer includes (A) a maleimide group-containing compound containing (a1) a divalent group having at least two imide bonds and (a2) a saturated or unsaturated divalent hydrocarbon group.

2. The multilayered transmission line plate of claim 1, comprising a first insulating layer (1-I) as the first insulating portion and a second insulating layer (1-II) as the second insulating portion, wherein the first insulating layer (1-I) is the resin layer and the second insulating layer (1-II) is the fiber base material layer.

3. The multilayered transmission line plate of claim 1, comprising an insulating layer (2-I) as the second insulating portion and a further insulating layer (2-II) as the first insulating portion, wherein the further insulating layer (2-II) includes two or more layers of a first insulating layer (2-IIA) and a second insulating layer (2-IIB) laminated on the first insulating layer (2-IIA), the insulating layer (2-I) is the fiber base material layer, the first insulating layer (2-IIA) is the resin layer, and the second insulating layer (2-IIB) is a further fiber base material layer.

4. The multilayered transmission line plate of claim 1, wherein a dielectric constant of the fiber base material is 5.0 or less.

5. The multilayered transmission line plate of claim 1, wherein (a2) the saturated or unsaturated divalent hydrocarbon group is a divalent aliphatic hydrocarbon group having 8 to 100 carbon atoms.

6. The multilayered transmission line plate of claim 1, wherein (A) the maleimide group-containing compound is an N-aliphatic substituted maleimide group-containing compound.

7. The multilayered transmission line plate of claim 6, wherein the resin layer further includes an N-aromatic substituted maleimide group-containing compound.

8. The multilayered transmission line plate of claim 1, wherein the fiber base material layer is a layer including a fiber base material and a resin composition, and a difference in dielectric constant between the fiber base material and the resin composition is 1.0 or less.

9. A multilayered transmission line plate comprising:
one pair of ground layers,
a differential wiring layer disposed between one ground layer and the other ground layer of the one pair of ground layers,
an insulating layer (3-I) disposed between the differential wiring layer and the one ground layer, no fiber base material layer being disposed between the differential wiring layer and the one ground layer, and
a further insulating layer (3-II) disposed between the differential wiring layer and the other ground layer, wherein the further insulating layer (3-II) has two or more layers of a first insulating layer (3-IIA) and a second insulating layer (3-IIB) laminated on the first insulating layer (3-IIA), the insulating layer (3-I) is a resin layer, the first insulating layer (3-IIA) is a resin layer, and the second insulating layer (3-IIB) is a fiber base material layer.

* * * * *